(12) United States Patent
Kobayashi et al.

(10) Patent No.: US 12,089,459 B2
(45) Date of Patent: Sep. 10, 2024

(54) DISPLAY APPARATUS AND ELECTRONIC DEVICE

(71) Applicant: Semiconductor Energy Laboratory Co., Ltd., Atsugi (JP)

(72) Inventors: Hidetomo Kobayashi, Isehara (JP); Hideaki Shishido, Atsugi (JP); Takayuki Ikeda, Atsugi (JP); Shuichi Katsui, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 432 days.

(21) Appl. No.: 17/603,067

(22) PCT Filed: Apr. 27, 2020

(86) PCT No.: PCT/IB2020/053908
§ 371 (c)(1),
(2) Date: Oct. 12, 2021

(87) PCT Pub. No.: WO2020/229911
PCT Pub. Date: Nov. 19, 2020

(65) Prior Publication Data
US 2022/0181428 A1 Jun. 9, 2022

(30) Foreign Application Priority Data
May 10, 2019 (JP) ................. 2019-089452

(51) Int. Cl.
*H10K 59/131* (2023.01)
*H10K 59/121* (2023.01)
*H10K 59/65* (2023.01)

(52) U.S. Cl.
CPC ....... *H10K 59/131* (2023.02); *H10K 59/1213* (2023.02); *H10K 59/1216* (2023.02); *H10K 59/65* (2023.02)

(58) Field of Classification Search
CPC ............. H10K 59/131; H10K 59/1213; H10K 59/1216; H10K 59/121
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| CN | 001799082 A | 7/2006 |
| CN | 101887689 A | 11/2010 |

(Continued)

OTHER PUBLICATIONS

International Search Report (Application No. PCT/IB2020/053908) Dated Jul. 21, 2020.

(Continued)

*Primary Examiner* — Wasiul Haider
(74) *Attorney, Agent, or Firm* — Eric J. Robinson; Robinson Intellectual Property Law Office, P.C.

(57) ABSTRACT

A display apparatus with low power consumption and high image quality is provided. The display apparatus includes a light-emitting element, a first transistor, a second transistor, a third transistor, a first capacitor, and a second capacitor. Preferably, one electrode of the light-emitting element is electrically connected to one of a source and a drain of the first transistor; the one electrode of the light-emitting element is electrically connected to one electrode of the first capacitor; a gate of the first transistor is electrically connected to one of a source and a drain of the second transistor; the gate of the first transistor is electrically connected to one electrode of the second capacitor; the other electrode of the second capacitor is electrically connected to the other electrode of the first capacitor; and the other electrode of the (Continued)

second capacitor is electrically connected to one of a source and a drain of the third transistor.

12 Claims, 17 Drawing Sheets

(56) References Cited

U.S. PATENT DOCUMENTS

| | | | |
|---|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,774,397 B2 | 8/2004 | Arao et al. |
| 6,819,389 B2 | 11/2004 | Imayama et al. |
| 7,009,664 B2 | 3/2006 | Imayama et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,095,047 B2 | 8/2006 | Arao et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,298,084 B2 | 11/2007 | Baude et al. |
| 7,323,356 B2 | 1/2008 | Hosono et al. |
| 7,335,597 B2 | 2/2008 | Arao et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,427,833 B2 | 9/2008 | Fish et al. |
| 7,453,065 B2 | 11/2008 | Saito et al. |
| 7,453,087 B2 | 11/2008 | Wasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,719,185 B2 | 5/2010 | Jin et al. |
| 7,732,251 B2 | 6/2010 | Hoffman et al. |
| 7,732,819 B2 | 6/2010 | Akimoto et al. |
| 7,745,798 B2 | 6/2010 | Takahashi |
| 7,749,825 B2 | 7/2010 | Honda |
| 7,795,621 B2 | 9/2010 | Yamaguchi et al. |
| 7,804,091 B2 | 9/2010 | Takechi et al. |
| 7,907,224 B2 | 3/2011 | Ito et al. |
| 7,943,985 B2 | 5/2011 | Kim et al. |
| 8,044,598 B2 | 10/2011 | Fukumoto et al. |
| 8,115,883 B2 | 2/2012 | Yamazaki et al. |
| 8,203,144 B2 | 6/2012 | Hoffman et al. |
| 8,222,098 B2 | 7/2012 | Honda |
| 8,232,124 B2 | 7/2012 | Takechi et al. |
| 8,253,252 B2 | 8/2012 | Shingu et al. |
| 8,519,628 B2 | 8/2013 | Fukumoto et al. |
| 8,647,031 B2 | 2/2014 | Hoffman et al. |
| 8,742,422 B2 | 6/2014 | Sakakura et al. |
| 8,785,990 B2 | 7/2014 | Honda |
| 8,786,587 B2 | 7/2014 | Kang et al. |
| 8,803,768 B2 | 8/2014 | Kimura et al. |
| 8,836,689 B2 | 9/2014 | Miyake |
| 8,860,108 B2 | 10/2014 | Yamazaki et al. |
| 8,884,852 B2 | 11/2014 | Yamamoto et al. |
| 9,280,931 B2 | 3/2016 | Kimura |
| 9,601,516 B2 | 3/2017 | Sakakura et al. |
| 9,922,600 B2 | 3/2018 | Kimura |
| 10,056,413 B2 | 8/2018 | Kimura |
| 10,615,189 B2 | 4/2020 | Kimura |
| 10,629,627 B2 | 4/2020 | Sakakura et al. |
| 10,854,640 B2 | 12/2020 | Sakakura et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0111663 A1 | 6/2003 | Yagi |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0263441 A1 | 12/2004 | Tanaka et al. |
| 2005/0017302 A1 | 1/2005 | Hoffman |
| 2005/0199959 A1 | 9/2005 | Chiang et al. |
| 2005/0275038 A1 | 12/2005 | Shih et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0132051 A1* | 6/2006 | Fish ............... G09G 3/3233 315/169.3 |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0023750 A1 | 2/2007 | Chaing et al. |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0057261 A1 | 3/2007 | Jeong et al. |
| 2007/0087487 A1 | 4/2007 | Honda |
| 2007/0090365 A1 | 4/2007 | Hayashi et al. |
| 2007/0105286 A1 | 5/2007 | Huh et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006827 A1 | 1/2008 | Shim et al. |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0073674 A1 | 3/2008 | Cho et al. |
| 2008/0080221 A1 | 4/2008 | Koo et al. |
| 2008/0083950 A1 | 4/2008 | Pan et al. |
| 2008/0106191 A1 | 5/2008 | Kawase |
| 2008/0119018 A1 | 5/2008 | Toyota et al. |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0233669 A1 | 9/2008 | Hirakata et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2008/0299702 A1 | 12/2008 | Son et al. |
| 2008/0308796 A1 | 12/2008 | Akimoto et al. |
| 2008/0308797 A1 | 12/2008 | Akimoto et al. |
| 2009/0001374 A1 | 1/2009 | Inoue et al. |
| 2009/0050876 A1 | 2/2009 | Marks et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0114918 A1 | 5/2009 | Wang et al. |
| 2009/0134399 A1 | 5/2009 | Sakakura et al. |
| 2009/0140438 A1 | 6/2009 | Yamazaki et al. |

(56) References Cited

U.S. PATENT DOCUMENTS

| | | |
|---|---|---|
| 2009/0152506 A1 | 6/2009 | Umeda et al. |
| 2009/0152541 A1 | 6/2009 | Maekawa et al. |
| 2009/0189155 A1 | 7/2009 | Akimoto |
| 2009/0189156 A1 | 7/2009 | Akimoto |
| 2009/0278122 A1 | 11/2009 | Hosono et al. |
| 2009/0278133 A1 | 11/2009 | Kim et al. |
| 2009/0280600 A1 | 11/2009 | Hosono et al. |
| 2009/0283762 A1 | 11/2009 | Kimura |
| 2009/0315451 A1 | 12/2009 | Choi et al. |
| 2010/0044701 A1 | 2/2010 | Sano et al. |
| 2010/0044711 A1 | 2/2010 | Imai |
| 2010/0059754 A1 | 3/2010 | Lee et al. |
| 2010/0065844 A1 | 3/2010 | Tokunaga |
| 2010/0084648 A1 | 4/2010 | Watanabe |
| 2010/0092800 A1 | 4/2010 | Itagaki et al. |
| 2010/0109002 A1 | 5/2010 | Itagaki et al. |
| 2010/0264420 A1 | 10/2010 | Honda |
| 2010/0289830 A1 | 11/2010 | Yamamoto. et al. |
| 2010/0309187 A1 | 12/2010 | Kang et al. |
| 2011/0031493 A1 | 2/2011 | Yamazaki et al. |
| 2011/0031496 A1 | 2/2011 | Yamazaki et al. |
| 2011/0032444 A1 | 2/2011 | Yamazaki et al. |
| 2011/0057187 A1 | 3/2011 | Sakakura et al. |
| 2011/0058116 A1 | 3/2011 | Yamazaki et al. |
| 2011/0210324 A1 | 9/2011 | Sakakura et al. |
| 2011/0210325 A1 | 9/2011 | Sakakura et al. |
| 2011/0210355 A1 | 9/2011 | Yamazaki et al. |
| 2012/0050274 A1 | 3/2012 | Yoo et al. |
| 2012/0126232 A1 | 5/2012 | Yamazaki et al. |
| 2013/0033475 A1 | 2/2013 | Miyake |
| 2013/0092930 A1 | 4/2013 | Kimura |
| 2013/0178004 A1 | 7/2013 | Hirakata et al. |
| 2014/0326998 A1 | 11/2014 | Honda |
| 2014/0346506 A1 | 11/2014 | Kimura et al. |
| 2017/0062483 A1 | 3/2017 | Kimura et al. |
| 2017/0243542 A1* | 8/2017 | Xiang .......... G09G 3/3291 |
| 2018/0033365 A1* | 2/2018 | Zhang .......... G09G 3/3233 |
| 2018/0151593 A1 | 5/2018 | Inoue et al. |
| 2020/0185429 A1 | 6/2020 | Kimura |
| 2021/0175256 A1 | 6/2021 | Sakakura et al. |

FOREIGN PATENT DOCUMENTS

| | | |
|---|---|---|
| CN | 101908316 A | 12/2010 |
| CN | 102387391 A | 3/2012 |
| EP | 2261884 A | 12/2010 |
| JP | 2006-527391 | 11/2006 |
| JP | 2007-096055 | 4/2007 |
| JP | 2007-123861 | 5/2007 |
| JP | 2010-266494 A | 11/2010 |
| JP | 2010-282169 A | 12/2010 |
| JP | 2011-119674 | 6/2011 |
| JP | 2013-054345 A | 3/2013 |
| JP | 2013-137509 A | 7/2013 |
| JP | 2018-093483 A | 6/2018 |
| KR | 2006-0015631 A | 2/2006 |
| KR | 2010-0122443 A | 11/2010 |
| KR | 2010-0131118 A | 12/2010 |
| KR | 2012-0019632 A | 3/2012 |
| KR | 2013-0016063 A | 2/2013 |
| KR | 2014-0092345 A | 7/2014 |
| KR | 2018-0061057 A | 6/2018 |
| TW | 201324486 | 6/2013 |
| TW | 201833898 | 9/2018 |
| WO | WO-2004/109640 | 12/2004 |
| WO | WO-2013/058199 | 4/2013 |

OTHER PUBLICATIONS

Written Opinion (Application No. PCT/IB2020/053908) Dated Jul. 21, 2020.

* cited by examiner

FIG. 11A1
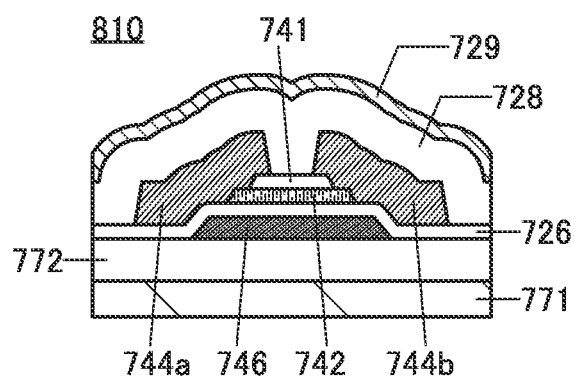
FIG. 11A2
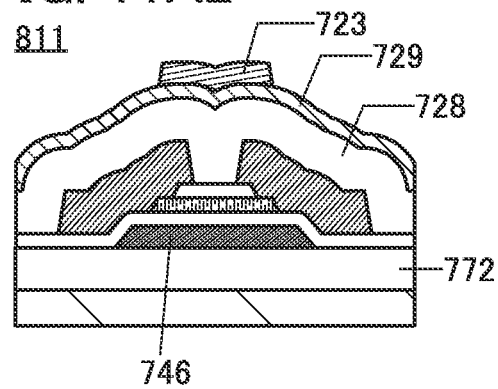
FIG. 11B1
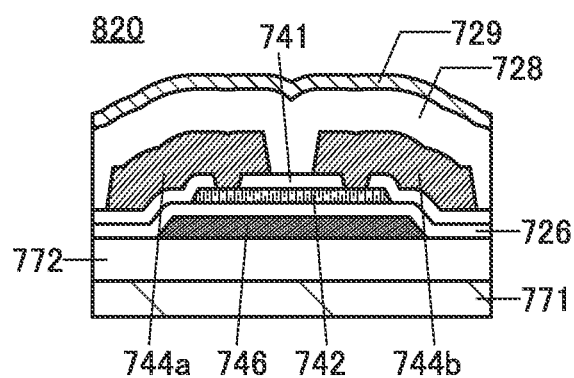
FIG. 11B2
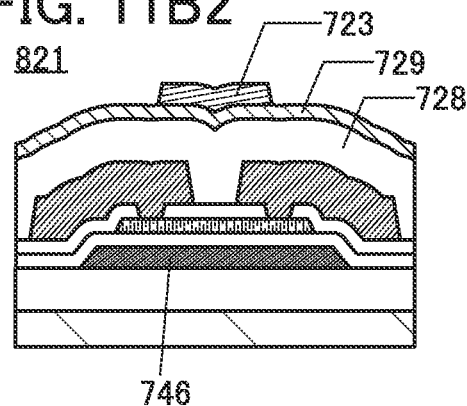
FIG. 11C1
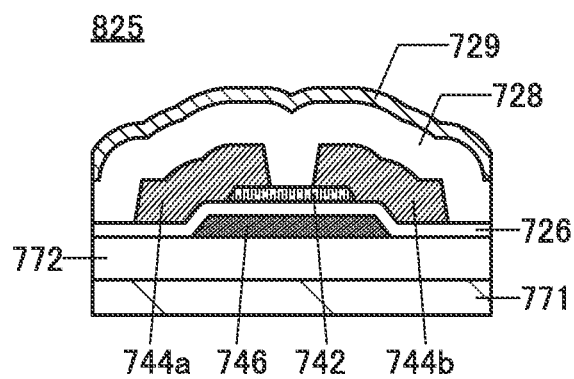
FIG. 11C2
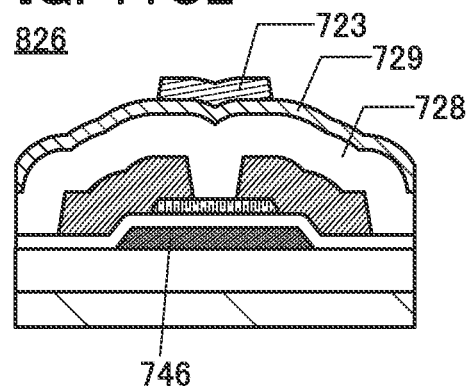

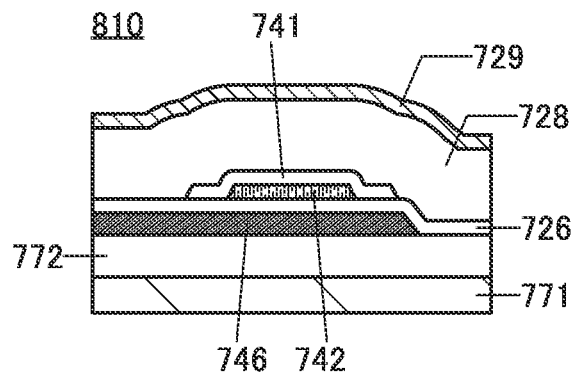
FIG. 12A1
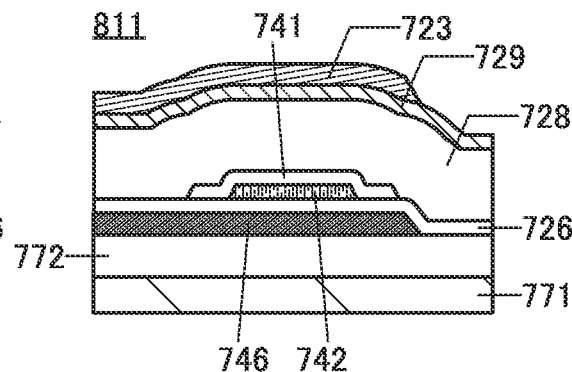
FIG. 12A2
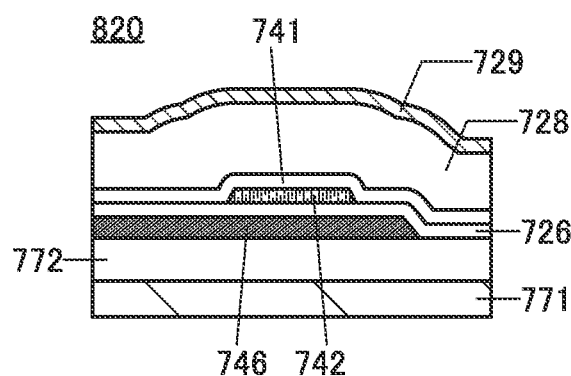
FIG. 12B1
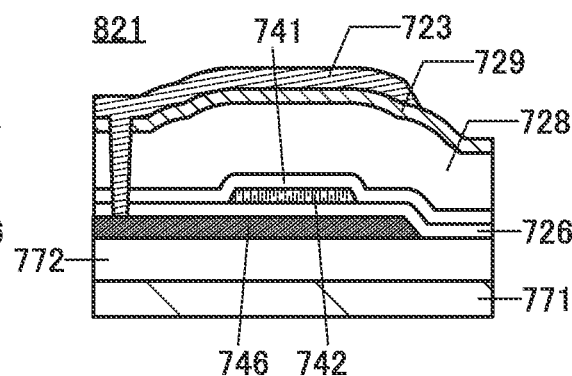
FIG. 12B2
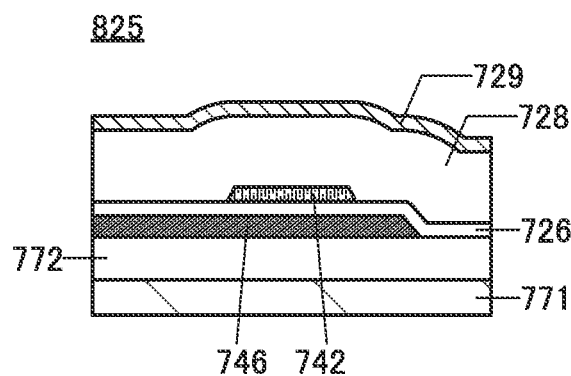
FIG. 12C1
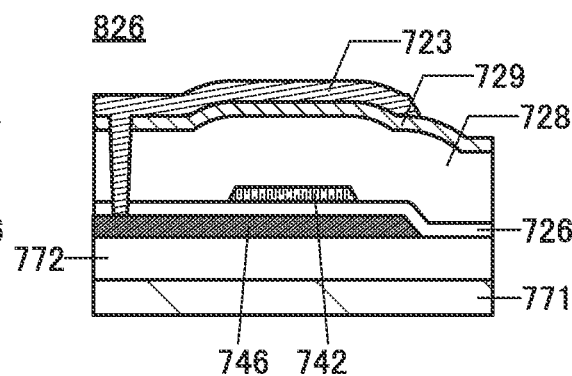
FIG. 12C2

FIG. 13A1
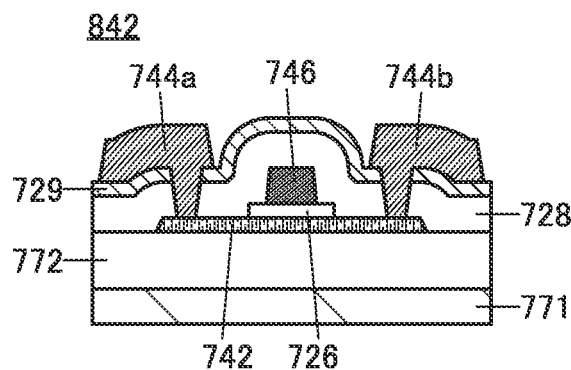
FIG. 13A2
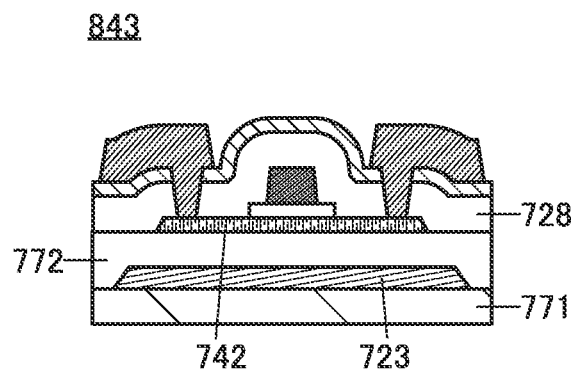
FIG. 13B1
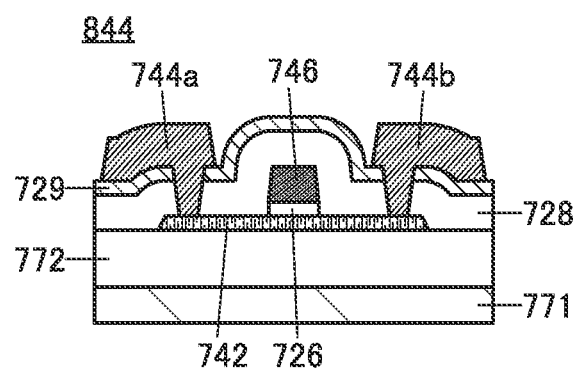
FIG. 13B2
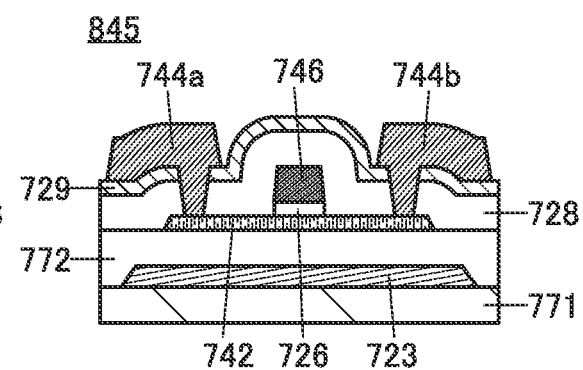
FIG. 13C1
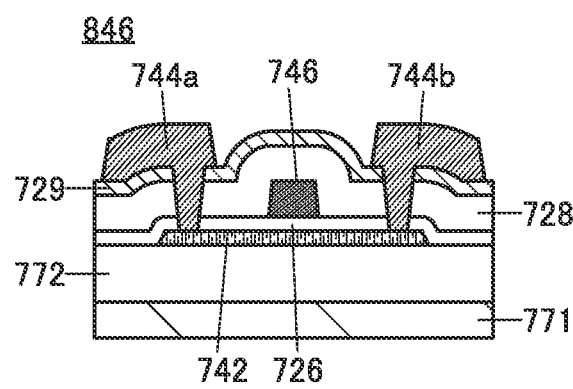
FIG. 13C2
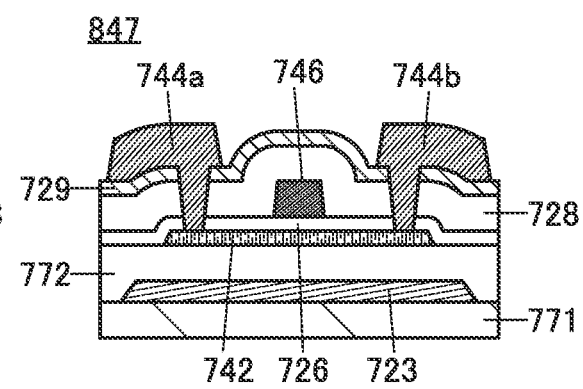

FIG. 14A1
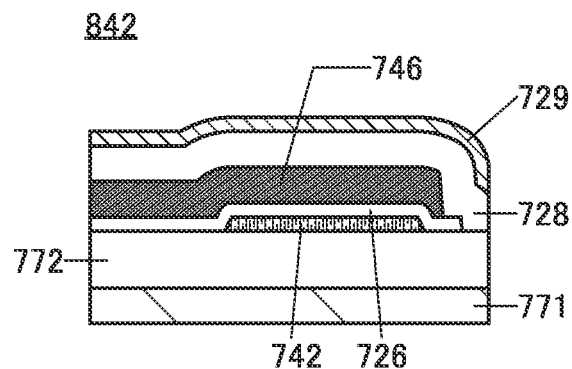
FIG. 14A2
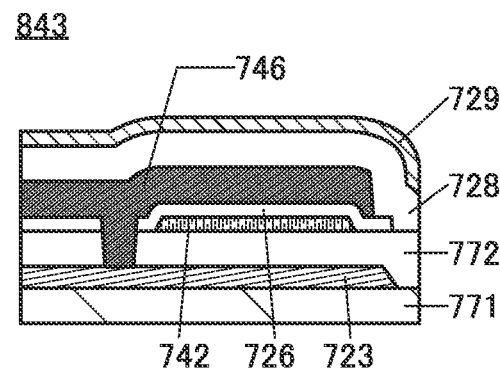
FIG. 14B1
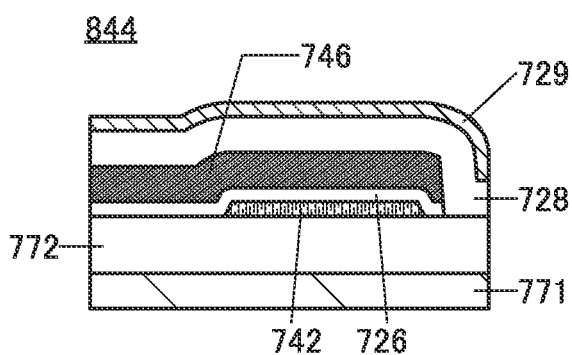
FIG. 14B2
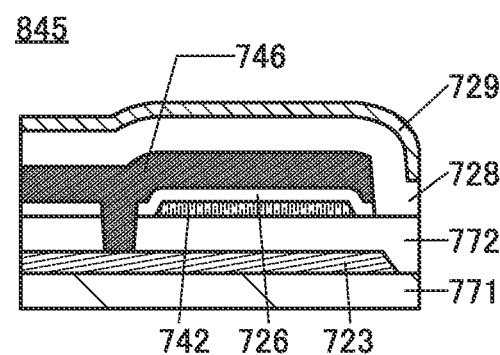
FIG. 14C1
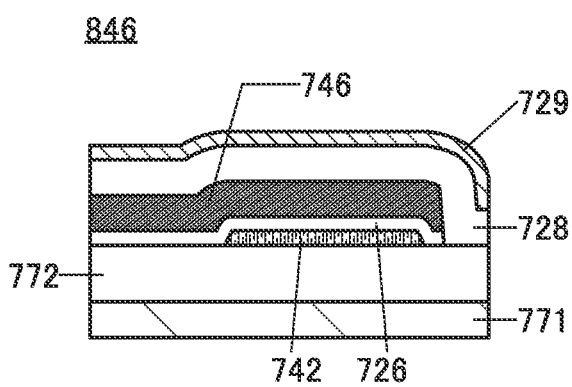
FIG. 14C2
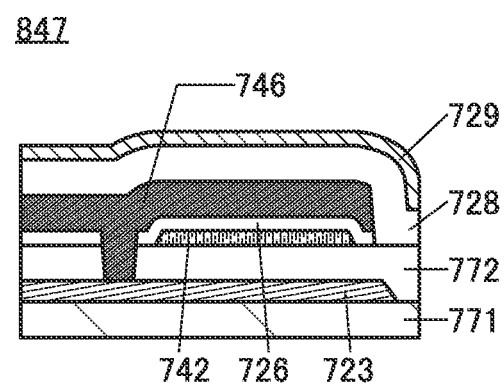

DISPLAY APPARATUS AND ELECTRONIC DEVICE

TECHNICAL FIELD

One embodiment of the present invention relates to a display apparatus.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Accordingly, more specific examples of the technical field of one embodiment of the present invention disclosed in this specification include a semiconductor device, a display apparatus, a liquid crystal display apparatus, a light-emitting apparatus, a lighting device, a power storage device, a memory device, an imaging device, an operation method thereof, and a manufacturing method thereof.

In this specification and the like, a semiconductor device generally means a device that can function by utilizing semiconductor characteristics. A transistor and a semiconductor circuit are embodiments of semiconductor devices. In some cases, a memory device, a display apparatus, an imaging device, or an electronic device includes a semiconductor device.

BACKGROUND ART

A technique for forming transistors using a metal oxide formed over a substrate has been attracting attention. For example, a technique in which a transistor formed using zinc oxide or In—Ga—Zn-based oxide is used as a switching element or the like of a pixel of a display apparatus is disclosed in Patent Document 1 and Patent Document 2.

Patent Document 3 discloses a memory device having a structure in which a transistor with an extremely low off-state current is used in a memory cell.

REFERENCE

Patent Document

[Patent Document 1] Japanese Published Patent Application No. 2007-123861
[Patent Document 2] Japanese Published Patent Application No. 2007-96055
[Patent Document 3] Japanese Published Patent Application No. 2011-119674

SUMMARY OF THE INVENTION

Problems to be Solved by the Invention

The resolution of display apparatuses has been increased; hardware capable of displaying images of an 8K4K (pixel count: 7680×4320) or higher resolution has been developed. In addition, the HDR (high dynamic range) display technique, which increases image quality by luminance adjustment, has been introduced.

For the proper display by a display apparatus, image data needs to match the resolution of the display apparatus. For example, in the case where a display apparatus has an 8K4K resolution and image data corresponds to a 4K2K resolution (pixel count: 3840×2160), the number of data needs to be quadrupled to provide full-screen display. By contrast, in the case where a display apparatus has a 4K2K resolution and image data corresponds to an 8K4K resolution, the number of data needs to be quartered.

In HDR processing, a dedicated circuit is necessary for generation of image data or conversion of the number of data, which causes a problem of an increase in power consumption. At least the conversion of original image data is preferably omitted when the data is input to pixels in a display apparatus.

In view of the above, an object of one embodiment of the present invention is to provide a display apparatus capable of improving image quality. Another object is to provide a display apparatus capable of performing proper display without conversion of image data. Another object is to provide a display apparatus capable of performing HDR display. Another object is to provide a display apparatus capable of performing upconversion operation. Another object is to provide a display apparatus capable of enhancing the luminance of a displayed image. Another object is to provide a display apparatus capable of displaying two images superimposed on each other.

Another object is to provide a display apparatus with low power consumption. Another object is to provide a highly reliable display apparatus. Another object is to provide a novel display apparatus or the like. Another object is to provide a method for driving any of the above display apparatuses. Another object is to provide a novel semiconductor device or the like.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention is a display apparatus including a light-emitting element, a first transistor, a second transistor, a third transistor, a first capacitor, a second capacitor, a first wiring, a second wiring, a third wiring, and a fourth wiring. Preferably, one electrode of the light-emitting element is electrically connected to one of a source and a drain of the first transistor; the one electrode of the light-emitting element is electrically connected to one electrode of the first capacitor; a gate of the first transistor is electrically connected to one of a source and a drain of the second transistor; the gate of the first transistor is electrically connected to one electrode of the second capacitor; the other electrode of the second capacitor is electrically connected to the other electrode of the first capacitor; the other electrode of the second capacitor is electrically connected to one of a source and a drain of the third transistor; a gate of the third transistor is electrically connected to the first wiring; a gate of the second transistor is electrically connected to the second wiring; the other of the source and the drain of the third transistor is electrically connected to the third wiring; and the other of the source and the drain of the second transistor is electrically connected to the fourth wiring.

Preferably, the above display apparatus further includes a fourth transistor and a fifth wiring. Preferably, one of a source and a drain of the fourth transistor is electrically connected to the one electrode of the light-emitting element, the other of the source and the drain of the fourth transistor is electrically connected to the fifth wiring, and a gate of the fourth transistor is electrically connected to the first wiring.

In the above display apparatus, it is preferred that the other of the source and the drain of the first transistor be electrically connected to a high potential power supply line, and that the other electrode of the light-emitting element be electrically connected to a low potential power supply line.

One embodiment of the present invention is a display apparatus including a light-emitting element, a first transistor, a second transistor, a third transistor, a first capacitor, a second capacitor, a first wiring, a second wiring, a third wiring, and a fourth wiring. Preferably, one electrode of the light-emitting element is electrically connected to one of a source and a drain of the first transistor; the other of the source and the drain of the first transistor is electrically connected to one electrode of the first capacitor; a gate of the first transistor is electrically connected to one of a source and a drain of the second transistor; the gate of the first transistor is electrically connected to one electrode of the second capacitor; the other electrode of the second capacitor is electrically connected to the other electrode of the first capacitor; the other electrode of the second capacitor is electrically connected to one of a source and a drain of the third transistor; a gate of the third transistor is electrically connected to the first wiring; a gate of the second transistor is electrically connected to the second wiring; the other of the source and the drain of the third transistor is electrically connected to the third wiring; and the other of the source and the drain of the second transistor is electrically connected to the fourth wiring.

In the above display apparatus, it is preferred that the other electrode of the light-emitting element be electrically connected to a high potential power supply line, and that the other of the source and the drain of the first transistor be electrically connected to a low potential power supply line.

In the above display apparatus, it is preferred that the first transistor further include a back gate, and that the back gate be electrically connected to the gate of the first transistor.

One embodiment of the present invention is a display apparatus including a light-emitting element, a first transistor, a second transistor, a third transistor, a fourth transistor, a first capacitor, a second capacitor, a first wiring, a second wiring, a third wiring, a fourth wiring, and a fifth wiring. Preferably, one electrode of the light-emitting element is electrically connected to one of a source and a drain of the first transistor; the other of the source and the drain of the first transistor is electrically connected to one of a source and a drain of the second transistor; the other of the source and the drain of the first transistor is electrically connected to one electrode of the first capacitor; a gate of the second transistor is electrically connected to one of a source and a drain of the third transistor; the gate of the second transistor is electrically connected to one electrode of the second capacitor; the other electrode of the second capacitor is electrically connected to the other electrode of the first capacitor; the other electrode of the second capacitor is electrically connected to one of a source and a drain of the fourth transistor; a gate of the fourth transistor is electrically connected to the first wiring; a gate of the third transistor is electrically connected to the second wiring; the other of the source and the drain of the fourth transistor is electrically connected to the third wiring; the other of the source and the drain of the third transistor is electrically connected to the fourth wiring; and a gate of the first transistor is electrically connected to the fifth wiring.

In the above display apparatus, it is preferred that the other of the source and the drain of the second transistor be electrically connected to a high potential power supply line, and that the other electrode of the light-emitting element be electrically connected to a low potential power supply line.

In the above display apparatus, it is preferred that the second transistor further include a back gate, and that the back gate be electrically connected to the gate of the second transistor.

In the above display apparatus, the light-emitting element is preferably an organic light-emitting diode.

In the above display apparatus, it is preferred that the first transistor, the second transistor, and the third transistor each include a metal oxide in a channel formation region, and that the metal oxide include indium, zinc, and an element M (one or more of aluminum, titanium, gallium, germanium, yttrium, zirconium, lanthanum, cerium, tin, neodymium, and hafnium).

One embodiment of the present invention is an electronic device including the above display apparatus and a camera.

Effect of the Invention

With the use of one embodiment of the present invention, a display apparatus capable of improving image quality can be provided. Alternatively, a display apparatus capable of performing proper display without conversion of image data can be provided. Alternatively, a display apparatus capable of performing HDR display can be provided. Alternatively, a display apparatus capable of performing upconversion operation can be provided. Alternatively, a display apparatus capable of enhancing the luminance of a displayed image can be provided. Alternatively, a display apparatus capable of displaying two images superimposed on each other can be provided.

Alternatively, a display apparatus with low power consumption can be provided. Alternatively, a highly reliable display apparatus can be provided. Alternatively, a novel display apparatus or the like can be provided. Alternatively, a method for driving any of the display apparatuses can be provided. Alternatively, a novel semiconductor device or the like can be provided.

BRIEF DESCRIPTION OF THE DRAWINGS

FIG. 11A1, FIG. 11A2, FIG. 11B1, FIG. 11B2, FIG. 11C1, and FIG. 11C2 are diagrams illustrating transistors.

FIG. 12A1, FIG. 12A2, FIG. 12B1, FIG. 12B2, FIG. 12C1, and FIG. 12C2 are diagrams illustrating transistors.

FIG. 13A1, FIG. 13A2, FIG. 13B1, FIG. 13B2, FIG. 13C1, and FIG. 13C2 are diagrams illustrating transistors.

FIG. 14A1, FIG. 14A2, FIG. 14B1, FIG. 14B2, FIG. 14C1, and FIG. 14C2 are diagrams illustrating transistors.

MODE FOR CARRYING OUT THE INVENTION

Figure 1:
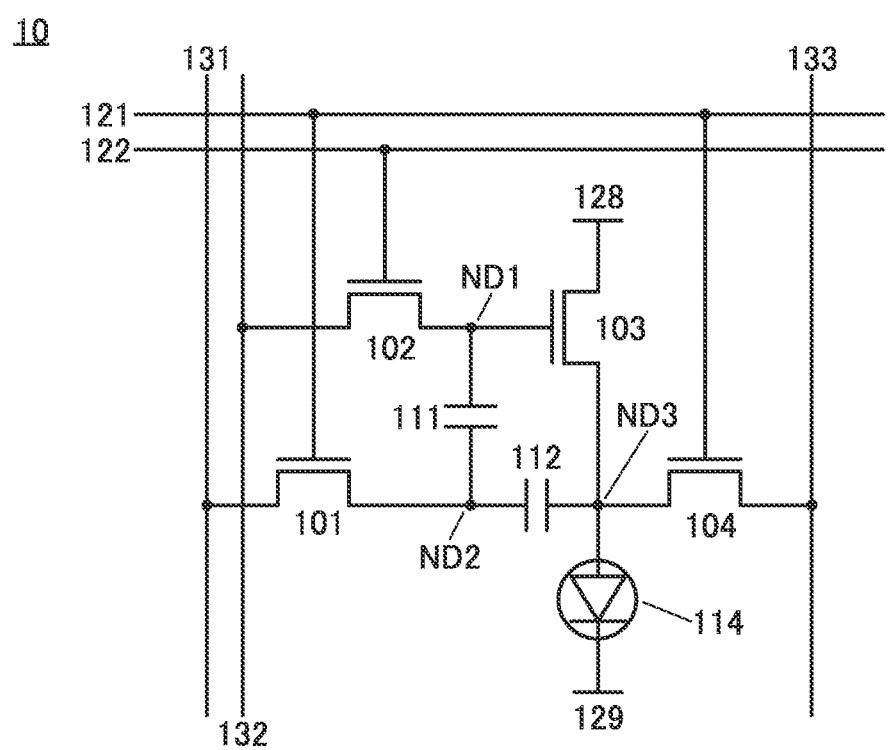
FIG. 1 is a diagram illustrating a pixel circuit.

Embodiments will be described in detail with reference to the drawings. Note that the present invention is not limited to the following description, and it will be readily understood by those skilled in the art that modes and details of the present invention can be modified in various ways without departing from the spirit and scope of the present invention. Therefore, the present invention should not be interpreted as being limited to the descriptions of the embodiments below. Note that in structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

Even in the case where a single component is illustrated in a circuit diagram, the component may be composed of a plurality of parts as long as there is no functional inconvenience. For example, in some cases, a plurality of transistors that operate as a switch are connected in series or in parallel. In some cases, capacitors are divided and arranged in a plurality of positions.

One conductor has a plurality of functions such as a wiring, an electrode, and a terminal in some cases. In this specification, a plurality of names are sometimes used for one component. Even in the case where components are illustrated in a circuit diagram as if they were directly connected to each other, the components may actually be connected to each other through a plurality of conductors; in this specification, even such a structure is included in the category of direct connection.

Embodiment 1

In this embodiment, a display apparatus of one embodiment of the present invention will be described with reference to drawings.

One embodiment of the present invention is a display apparatus having a function of correcting image data in pixels. A storage node is provided in each pixel, and first data can be held in the storage node. The first data is added to second data by capacitive coupling and can be supplied to a display element. Alternatively, the first data can be added by capacitive coupling after the second data is written to the storage node.

Thus, the display apparatus can display a corrected image. Through the correction, image upconversion can be performed. Alternatively, HDR display can be performed by correction of part or the whole of an image in a display region. Alternatively, the luminance of a displayed image can be significantly increased when the same image data is used as the first data and the second data. Alternatively, given images superimposed on each other can be displayed when different image data are used as the first data and the second data.

With the use of one embodiment of the present invention, proper display can be performed without additionally providing a dedicated circuit to perform upconversion or downconversion of both image data for high resolution and image data for low resolution. In the case of high-resolution display, individual data is supplied to each pixel through a first transistor included in the pixel. In the case of low-resolution display, the same data is supplied to a plurality of pixels through a second transistor electrically connected to the plurality of pixels.

The image data for high resolution here corresponds to, for example, data having the amount of information corresponding to 8K4K (pixel count: 7680×4320). The image data for low resolution corresponds to, for example, data having the amount of information corresponding to 4K2K (pixel count: 3840×2160). That is, it is assumed that the ratio of the amount of effective image data (corresponding to the number of effective pixels) for high resolution to that for low resolution is 4:1.

Note that as long as the ratio between the amounts of data (pixel counts) is 4:1, the image data for high resolution may be data corresponding to 4K2K and the image data for low resolution may be data corresponding to Full HD (pixel count: 1920×1080) without limitation to the above example. Alternatively, the image data for high resolution may be data corresponding to 16K8K (pixel count: 15360×8640) and the image data for low resolution may be data corresponding to 8K4K.

Note that in this specification and the like, a pixel refers to one element whose brightness can be controlled, for example. Therefore, for example, one pixel refers to one color element by which brightness is expressed. Accordingly, in the case of a color liquid crystal display apparatus made of color elements of R (Red), G (Green), and B (Blue), a minimum unit of an image is composed of three pixels of an R pixel, a G pixel, and a B pixel. In this case, each of the RGB pixels may be referred to as a subpixel, and RGB subpixels may be collectively referred to as a pixel.

Structure Example 1

FIG. 1 illustrates a structure of a pixel 10 that can be used in a display apparatus of one embodiment of the present invention. The pixel 10 includes a transistor 101, a transistor 102, a transistor 103, a transistor 104, a capacitor 111, a capacitor 112, and a light-emitting element 114.

One electrode of the light-emitting element 114 is electrically connected to one of a source and a drain of the transistor 103. The one electrode of the light-emitting element 114 is electrically connected to one electrode of the capacitor 112. A gate of the transistor 103 is electrically connected to one of a source and a drain of the transistor 102. The gate of the transistor 103 is electrically connected to one electrode of the capacitor 111. The other electrode of the capacitor 111 is electrically connected to the other electrode of the capacitor 112. The other electrode of the capacitor 111 is electrically connected to one of a source and a drain of the transistor 101. The one electrode of the light-emitting element 114 is electrically connected to one of a source and a drain of the transistor 104.

Examples of the light-emitting element 114 include self-light-emitting elements such as a light-emitting diode (LED), an organic light-emitting diode (OLED), a light-emitting diode in which quantum dots are used in a light-emitting layer (QLED: Quantum-dot Light Emitting Diode), and a semiconductor laser. It is also possible to use, for instance, a MEMS (Micro Electro Mechanical Systems) shutter element, an optical interference type MEMS element, or a display element using a microcapsule method, an electrophoretic method, an electrowetting method, an Electronic Liquid Powder (registered trademark) method, or the like.

Here, a wiring to which the one of the source and the drain of the transistor 102, the one electrode of the capacitor 111, and the gate of the transistor 103 are connected is referred to as a node ND1. A wiring to which the one of the source and the drain of the transistor 101, the other electrode of the capacitor 111, and the other electrode of the capacitor 112 are connected is referred to as a node ND2. A wiring to which the one of the source and the drain of the transistor 103, the one electrode of the capacitor 112, and the one electrode of the light-emitting element 114 are connected is referred to as a node ND3.

The transistor 103 functions as a driving transistor that controls the amount of current fed to the light-emitting element 114. The transistor 101 and the transistor 102 each function as a selection transistor that selects a pixel. The transistor 104 has a function of preventing occurrence of a malfunction such as flow of unintentional current through the light-emitting element 114 when the potential of the node ND3 becomes higher than or equal to the threshold voltage of the light-emitting element 114. Specifically, the transistor 104 functions as a switch for preventing current from flowing during a period other than a period in which current is fed to the light-emitting element 114 (also referred to as a light-emitting period).

A gate of the transistor 101 and a gate of the transistor 104 are electrically connected to a wiring 121. A gate of the transistor 102 is electrically connected to a wiring 122. The other of the source and the drain of the transistor 101 is electrically connected to a wiring 131. The other of the source and the drain of the transistor 102 is electrically connected to a wiring 132. The other of the source and the drain of the transistor 104 is electrically connected to a wiring 133.

The other of the source and the drain of the transistor 103 is electrically connected to a wiring 128. The other electrode of the light-emitting element 114 is electrically connected to a wiring 129. The wiring 128 and the wiring 129 each function as a wiring (power supply line) to which a power supply potential is supplied. For example, the wiring 128 can function as a high potential power supply line. The wiring 129 can function as a low potential power supply line.

The wiring 121 and the wiring 122 have a function of a scan line for controlling the operation of the transistor 101, the transistor 102, and the transistor 104. A scan signal supplied to the scan line is a signal for controlling the conducting state or non-conducting state (on or off) of the selection transistor (the transistor 101 and the transistor 102) that functions as a switch in the pixel 10. Moreover, a scan signal supplied to the scan line is a signal for controlling the conducting state or non-conducting state (on or off) of the transistor 104. The wiring 132 has a function of a data line that supplies first data. A data signal transmitted through the data line is a signal for displaying an image. The wiring 131 has a function of a data line that supplies second data. The wiring 131 has a function of supplying a specific potential (reference voltage) "Vref" for driving the pixel 10. The wiring 133 has a function of a wiring that supplies a constant potential (V0).

The pixel is supplied with "Vref" and first data (e.g., correction data) in the same period and performs capacitive coupling operation described later. For this reason, when "Vref" is supplied from a signal line, at least a signal line for supplying the first data and a signal line for supplying "Vref" or second data (e.g., image data) are needed.

The node ND1 is a storage node, and data supplied to the wiring 132 can be written to the node ND1 when the transistor 102 is turned on. When the transistor 102 is turned off, the data can be held in the node ND1.

The node ND2 is a storage node, and data supplied to the wiring 131 can be written to the node ND2 when the transistor 101 is turned on. When the transistor 101 is turned off, the data can be held in the node ND2.

The node ND3 is a storage node, and data supplied to the wiring 133 can be written to the node ND3 when the transistor 104 is turned on. When the transistor 104 is turned off, the data can be held in the node ND3.

A transistor having an extremely low off-state current is preferably used as at least one of the transistor 101, the transistor 102, the transistor 103, and the transistor 104. In particular, when transistors having an extremely low off-state current are used as the transistor 101, the transistor 102, and the transistor 104, leakage current can be reduced. Moreover, the potentials of the node ND1, the node ND2, and the node ND3 can be held for a long time. As the transistor, a transistor using a metal oxide in a channel formation region (hereinafter an OS transistor) can be suitably used, for example.

It is further preferable that OS transistors be used as all the transistors 101, 102, 103, and 104. An OS transistor may be used as a transistor other than the transistor 101, the transistor 102, the transistor 103, and the transistor 104. In the case of operating within a range where the amount of leakage current is acceptable, a transistor containing silicon in a channel formation region (hereinafter a Si transistor) may be used. Alternatively, an OS transistor and a Si transistor may be used together. Examples of the Si transistor include a transistor containing amorphous silicon and a transistor containing crystalline silicon (microcrystalline silicon, low-temperature polysilicon, or single crystal silicon). Note that the transistors illustrated in FIG. 1 are all re-channel transistors, but p-channel transistors can also be used.

As a semiconductor material used for an OS transistor, a metal oxide whose energy gap is greater than or equal to 2 eV, preferably greater than or equal to 2.5 eV, further preferably greater than or equal to 3 eV can be used. A typical example thereof is an oxide semiconductor containing indium, and a CAAC-OS (C-Axis Aligned Crystalline Oxide Semiconductor) or a CAC-OS (Cloud-Aligned Composite Oxide Semiconductor), each of which will be described later, or the like can be used, for example. A CAAC-OS has a stable crystal structure and is suitable for a transistor that is required to have high reliability, for example. A CAC-OS has high mobility and is suitable for a transistor that operates at high speed, for example.

Since the semiconductor layer of an OS transistor has a large energy gap, the OS transistor can exhibit extremely low off-state current characteristics with an off-state current per micrometer of a channel width of several yA/μm (y is $10^{-24}$). An OS transistor has features such that impact ionization, an avalanche breakdown, a short-channel effect, and the like do not occur, which are different from those of a Si transistor. Thus, the use of an OS transistor enables formation of a highly reliable circuit. Moreover, variations in electrical characteristics due to crystallinity unevenness, which are caused in Si transistors, are less likely to occur in OS transistors.

The semiconductor layer included in the OS transistor can be, for example, a film represented by an In-M-Zn-based oxide that contains indium, zinc, and an element M (one or more of aluminum, titanium, gallium, germanium, yttrium, zirconium, lanthanum, cerium, tin, neodymium, and hafnium).

In the case where the oxide semiconductor contained in the semiconductor layer is an In-M-Zn-based oxide, it is preferable that the atomic ratio of the metal elements in a sputtering target used for forming a film of the In-M-Zn oxide satisfy In≥M and Zn≥M. The atomic ratio of the metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio of the metal elements in the formed semiconductor layer may vary from the above atomic ratio of the metal elements in the sputtering target in a range of ±40%.

An oxide semiconductor with a low carrier concentration is used for the semiconductor layer. For example, an oxide semiconductor that has a carrier concentration lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, yet further preferably lower than $1\times10^{10}/cm^3$ and higher than or equal to $1\times10^{-9}/cm^3$ can be used for the semiconductor layer. Such an oxide semiconductor is referred to as a highly purified intrinsic or substantially highly purified intrinsic oxide semiconductor. The oxide semiconductor has a low density of defect states and can thus be regarded as an oxide semiconductor having stable characteristics.

Note that examples of a material for the semiconductor layer are not limited to those described above, and a material with an appropriate composition can be used in accordance with required semiconductor characteristics and electrical characteristics (e.g., field-effect mobility and threshold voltage) of the transistor. To obtain the required semiconductor characteristics of the transistor, it is preferable that the carrier concentration, the impurity concentration, the defect density, the atomic ratio of a metal element to oxygen, the interatomic distance, the density, and the like of the semiconductor layer be set to appropriate values.

When the oxide semiconductor in the semiconductor layer contains silicon or carbon, which is an element belonging to Group 14, the amount of oxygen vacancies is increased in the semiconductor layer, and the semiconductor layer becomes n-type. Thus, the concentration of silicon or carbon in the semiconductor layer (the concentration obtained by secondary ion mass spectrometry) is $2\times10^{18}$ atoms/cm$^3$ or lower, preferably $2\times10^{17}$ atoms/cm$^3$ or lower.

An alkali metal and an alkaline earth metal might generate carriers when bonded to a component contained in an oxide semiconductor, in which case the off-state current of the transistor might increase. Therefore, the concentration of an alkali metal or an alkaline earth metal in the semiconductor layer (the concentration obtained by secondary ion mass spectrometry) is $1\times10^{18}$ atoms/cm$^3$ or lower, preferably $2\times10^{16}$ atoms/cm$^3$ or lower.

When nitrogen is included in the oxide semiconductor forming the semiconductor layer, electrons serving as carriers are generated in the oxide semiconductor and the carrier concentration increases; hence, the semiconductor layer easily becomes n-type. Thus, a transistor using an oxide semiconductor that contains nitrogen is likely to have normally-on characteristics. Therefore, the concentration of nitrogen in the semiconductor layer (the concentration obtained by secondary ion mass spectrometry) is preferably $5\times10^{18}$ atoms/cm$^3$ or lower.

When hydrogen is contained in the oxide semiconductor forming the semiconductor layer, hydrogen reacts with oxygen bonded to a metal atom contained in the oxide semiconductor to be water, and thus sometimes causes an oxygen vacancy in the oxide semiconductor. If the channel formation region in the oxide semiconductor includes oxygen vacancies, the transistor sometimes has normally-on characteristics. In some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor including an oxide semiconductor that contains a large amount of hydrogen is likely to have normally-on characteristics.

A defect in which hydrogen has entered an oxygen vacancy can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration of the oxide semiconductor obtained by secondary ion mass spectrometry (SIMS) is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with sufficiently reduced impurities such as hydrogen is used for a channel formation region of a transistor, the transistor can have stable electrical characteristics.

Oxide semiconductors (metal oxides) are classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor. Among the non-single-crystal structures, an amorphous structure has the highest density of defect states, whereas the CAAC-OS has the lowest density of defect states.

An oxide semiconductor film having an amorphous structure has disordered atomic arrangement and no crystalline component, for example. In another example, an oxide film having an amorphous structure has a completely amorphous structure and no crystal part.

Note that the semiconductor layer may be a mixed film including two or more of the following: a region having an amorphous structure, a region having a microcrystalline structure, a region having a polycrystalline structure, a region of a CAAC-OS, and a region having a single crystal structure. The mixed film has, for example, a single-layer structure or a layered structure including two or more of the foregoing regions in some cases.

The composition of a CAC-OS, which is one embodiment of a non-single-crystal semiconductor layer, will be described below.

The CAC-OS has, for example, a composition in which elements contained in an oxide semiconductor are unevenly distributed. Materials containing unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions containing the metal element(s) are mixed is referred to as a mosaic pattern or a patch-like pattern. The region has a size greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region containing $GaO_{X3}$ as a main component and a region containing $In_{X2}Zn_{Y2}O_{Z2}$ or $InO_{X1}$ as a main component are mixed. Note that in this specification, when the atomic ratio of In to the element M in a first region is greater than the atomic ratio of In to the element M in a second region, for example, the first region is described as having a higher In concentration than the second region.

Note that a compound containing In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ (−1≤x0≤1; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

The CAC-OS relates to the material composition of an oxide semiconductor. In a material composition of a CAC-OS containing In, Ga, Zn, and O, nanoparticle regions containing Ga as a main component are observed in part of the CAC-OS and nanoparticle regions containing In as a main component are observed in part thereof. These nanoparticle regions are randomly dispersed to form a mosaic pattern. Thus, the crystal structure is a secondary element for the CAC-OS.

Note that in the CAC-OS, a layered structure including two or more films with different compositions is not included. For example, a two-layer structure of a film containing In as a main component and a film containing Ga as a main component is not included.

A boundary between the region containing $GaO_{X3}$ as a main component and the region containing $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions containing the selected metal element(s) as a main component(s) are observed in part of the CAC-OS and nanoparticle regions containing In as a main component are observed in part of the CAC-OS, and these nanoparticle regions are randomly dispersed to form a mosaic pattern in the CAC-OS.

The CAC-OS can be formed by a sputtering method under a condition where a substrate is not heated, for example. In the case where the CAC-OS is formed by a sputtering method, one or more of an inert gas (typically, argon), an oxygen gas, and a nitrogen gas are used as a deposition gas. The flow rate of the oxygen gas with respect to the total flow rate of the deposition gas in deposition is preferably as low as possible; for example, the flow rate of the oxygen gas is preferably higher than or equal to 0% and lower than 30%, further preferably higher than or equal to 0% and lower than or equal to 10%.

The CAC-OS is characterized in that a clear peak is not observed when measurement is conducted using a θ/2θ scan by an out-of-plane method, which is an X-ray diffraction (XRD) measurement method. That is, it is found by the X-ray diffraction measurement that there are no alignment in the a-b plane direction and no alignment in the c-axis direction in the measured areas.

In an electron diffraction pattern of the CAC-OS that is obtained by irradiation with an electron beam with a probe diameter of 1 nm (also referred to as a nanobeam electron beam), a ring-like high-luminance region (ring region) and a plurality of bright spots in the ring region are observed. Thus, it is found from the electron diffraction pattern that the crystal structure of the CAC-OS includes an nc (nanocrystal) structure that does not show alignment in the plane direction and the cross-sectional direction.

For example, energy dispersive X-ray spectroscopy (EDX) is used to obtain EDX mapping, and according to the EDX mapping, the CAC-OS of the In—Ga—Zn oxide has a composition in which the regions containing $GaO_{X3}$ as a main component and the regions containing $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, the region containing $GaO_{X3}$ or the like as a main component and the region containing $In_{X2}Zn_{Y2}O_{Z2}$ or $InO_{X1}$ as a main component are separated to form a mosaic pattern.

The conductivity of the region containing $In_{X2}Zn_{Y2}O_{Z2}$ or $InO_{X1}$ as a main component is higher than that of the region containing $GaO_{X3}$ or the like as a main component. In other words, when carriers flow through the region containing $In_{X2}Zn_{Y2}O_{Z2}$ or $InO_{X1}$ as a main component, the conductivity of an oxide semiconductor is exhibited. Accordingly, when the regions containing $In_{X2}Zn_{Y2}O_{Z2}$ or $InO_{X1}$ as a main component are distributed like a cloud in an oxide semiconductor, high field-effect mobility (μ) can be achieved.

By contrast, the insulating property of the region containing $GaO_{X3}$ or the like as a main component is superior to that of the region containing $In_{X2}Zn_{Y2}O_{Z2}$ or $InO_{X1}$ as a main component. In other words, when the regions containing $GaO_{X3}$ or the like as a main component are distributed in an oxide semiconductor, leakage current can be suppressed and favorable switching operation can be achieved.

Accordingly, when a CAC-OS is used in a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

A semiconductor element using a CAC-OS has high reliability. Thus, the CAC-OS is suitably used as a material in a variety of semiconductor devices.

An example of the operation of the pixel 10 for adding correction data to image data will be described with reference to a timing chart shown in FIG. 2. Note that in the following description, a high potential is represented by "High" and a low potential is represented by "Low". The correction data, the image data, and a specific potential are represented by "Vw", "Vdata", and "Vref", respectively. As "Vref", 0 V, a GND potential, or a certain reference potential can be used, for example. Note that "Vw" and "Vdata" can also be referred to as given first data and given second data, respectively.

First, the operation of writing the correction data "Vw" to the node ND1 will be described. Note that in potential distribution, potential coupling, or potential loss, detailed changes due to a circuit structure, operation timing, or the like are not considered here.

At Time T1, the potential of the wiring 121 is set to "High", the potential of the wiring 122 is set to "High", the potential of the wiring 131 is set to "Vref", and the potential of the wiring 132 is set to "Vw"; thus, the transistor 101, the transistor 102, and the transistor 104 are turned on, and the potential "Vw" of the wiring 132, the potential "Vref" of the wiring 131, and the potential "V0" of the wiring 133 are written to the node ND1, the node ND2, and the node ND3, respectively. "V0" is preferably a potential with which current is not fed to the light-emitting element 114, that is, a potential lower than or equal to the threshold voltage of the light-emitting element 114.

At this time, when a difference between potentials applied to both ends of the capacitor 111 is V1, the potential difference V1 can be expressed by Formula (1).

$$V1 = Vw - Vref \quad (1)$$

Similarly, when a difference between potentials applied to both ends of the capacitor 112 is V2, the potential difference V2 can be expressed by Formula (2).

$$V2 = Vref - V0 \quad (2)$$

The operation of writing the correction data "Vw" has been described so far. Note that in the case where correction is not performed, the same potential as "Vref" is supplied as the correction data "Vw" in the above operation.

Next, the operation of correcting the image data "Vdata" will be described.

At Time T2, the potential of the wiring 121 is set to "High", the potential of the wiring 122 is set to "Low", and the potential of the wiring 131 is set to "Vdata"; thus, the transistor 102 is turned off and the node ND1 becomes floating. Moreover, the potential of the node ND2 changes from "Vref" to "Vdata".

At this time, the difference between potentials applied to both ends of the capacitor 111 is kept at the value expressed by Formula (1); hence, when the potential of the node ND1 is denoted by Vx, Vx can be expressed by Formula (3).

$$Vx = Vw - Vref + Vdata \quad (3)$$

Here, when 0 V is assigned to Vref, Formula (4) is obtained.

$$Vx = Vw + Vdata \quad (4)$$

As shown in Formula (4), the potential Vx of the node ND1 can have a value obtained by adding the image data "Vdata" to the correction data "Vw". In other words, images can be superimposed by adding a signal held in the memory circuit and a signal to be written subsequently.

The above is the description of the operation of correcting the image data "Vdata".

Next, the display operation will be described.

At Time T3, the potential of the wiring 121 is set to "Low" and the potential of the wiring 122 is set to "Low"; thus, the transistor 101 and the transistor 104 are turned off, a voltage Vgs between the gate and source of the transistor 103 becomes the voltage held in the capacitor 111 and the capacitor 112, and a current corresponding to Vgs flows through the light-emitting element 114. At this time, the potential of the node ND1 becomes "Vw+Vdata+a", the potential of the node ND2 becomes "Vdata+a", and the potential of the node ND3 becomes "V0+a". Note that a is a constant and represents the amount of change of the potential of the electrode of the light-emitting element 114 that is connected to the transistor 103 from V0 to a potential required to feed a current corresponding to Vgs.

Figure 2:
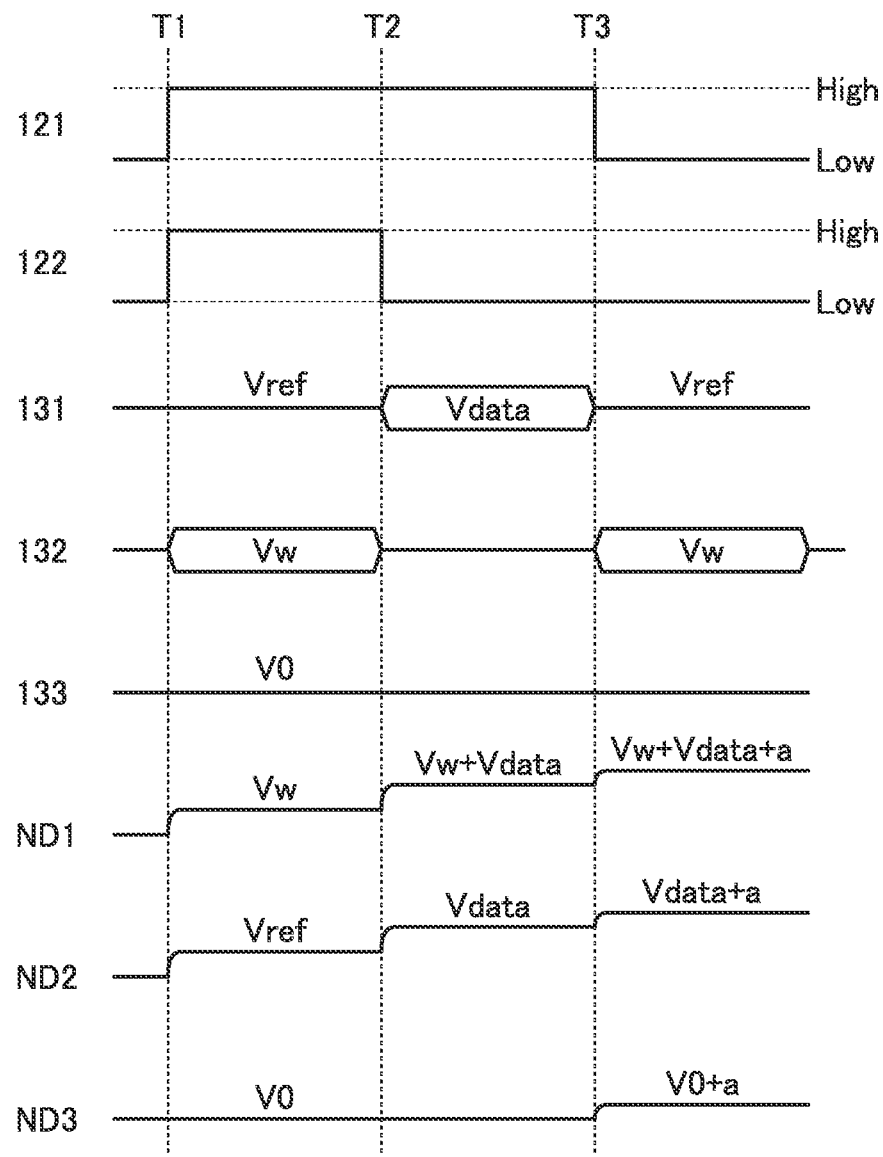
FIG. 2 is a timing chart showing the operation of a pixel circuit.

The operations in FIG. 2 can be sequentially performed in one horizontal period.

Such a combination of the image data and the correction data enables upconversion, HDR display, correction of display unevenness unique to display apparatuses, and correction of the threshold voltage of transistors included in pixels, for example. Alternatively, they can be performed in combination.

In the upconversion operation, the same image data is supplied to four adjacent pixels (for two rows and two columns), for example. The supplied image data are corrected (converted) into different image data in the respective pixels, and display in each pixel can be performed. For example, image data that is applied to one given pixel among data for 4K2K is input to four given pixels in a display apparatus having a pixel count corresponding to 8K4K, and different correction data are input to the four pixels, whereby display with increased resolution can be performed.

The display apparatus of one embodiment of the present invention can display different images superimposed on each other, which is the correction of image data in a broad sense. For example, it is possible to display a composite image in which a first image composed of the image data "Vdata" and a second image composed of the correction data "Vw" are superimposed on each other. Such a combination of the image data and the correction data enables improvement in luminance of the entire displayed image, for example, as well as display of an image synthesized from different images. For example, the combination can be applied to insertion of text, AR (Augmented Reality) display, and the like.

In the display apparatus of one embodiment of the present invention, a high voltage can be applied to the display element even by using a general-purpose driver IC. For example, a voltage that is supplied from a driver IC in order to drive the light-emitting element or the like can be approximately halved; thus, power consumption of the display apparatus can be reduced. As another example, by writing the same image data twice, the current flowing through the light-emitting element can be increased, so that the luminance of the display can be increased.

Structure Example 2

Figure 3:
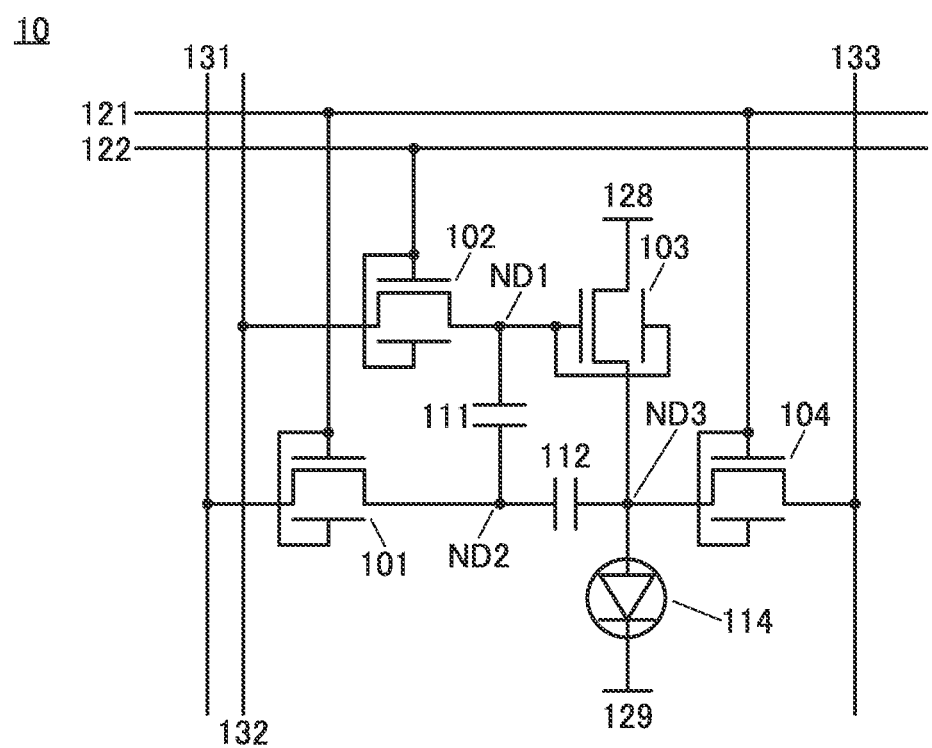
FIG. 3 is a diagram illustrating a pixel circuit.

FIG. 3 illustrates a structure different from that of the pixel 10 illustrated in FIG. 1. As illustrated in FIG. 3, the transistor 101, the transistor 102, the transistor 103, and the transistor 104 may each include a back gate. In particular, the transistor 103 functioning as a driving transistor of the light-emitting element 114 preferably includes a back gate. FIG. 3 shows a structure in which the back gates are electrically connected to the respective gates (sometimes referred to as front gates); the structure has an effect of increasing the on-state current. When the transistor includes the back gate, the saturation characteristics of the transistor can be improved. Note that the back gate may be electrically connected to a wiring capable of supplying a constant potential (not illustrated) so that the threshold voltage of the transistor can be controlled. Note that although all of the transistors have back gates in FIG. 3, a transistor without a back gate may be included.

Structure Example 3

Figure 4:
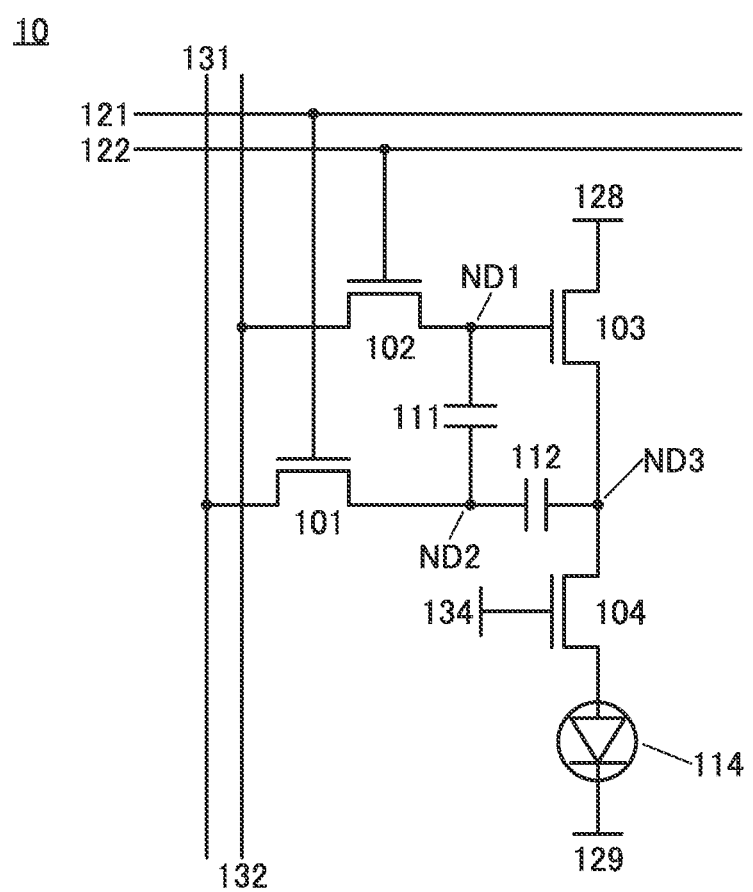
FIG. 4 is a diagram illustrating a pixel circuit.

FIG. 4 illustrates a structure different from that of the pixel 10 illustrated in FIG. 1. The pixel 10 illustrated in FIG. 4 is different from the pixel 10 illustrated in FIG. 1 in that the wiring 133 is not provided, the other of the source and the drain of the transistor 104 is electrically connected to one of the source and the drain of the transistor 103, and the gate of the transistor 104 is electrically connected to a wiring 134. The wiring 134 can have a function of a signal line that controls the conduction of the transistor 104.

One electrode of the light-emitting element 114 is electrically connected to one of the source and the drain of the transistor 104. The other of the source and the drain of the transistor 104 is electrically connected to one of the source and the drain of the transistor 103. The other of the source and the drain of the transistor 104 is electrically connected to one electrode of the capacitor 112. The gate of the transistor 103 is electrically connected to one of the source and the drain of the transistor 102. The gate of the transistor 103 is electrically connected to one electrode of the capacitor 111. The other electrode of the capacitor 111 is electrically connected to the other electrode of the capacitor 112. The other electrode of the capacitor 111 is electrically connected to one of the source and the drain of the transistor 101.

The gate of the transistor 101 is electrically connected to the wiring 121. The gate of the transistor 102 is electrically connected to the wiring 122. The other of the source and the drain of the transistor 101 is electrically connected to the wiring 131. The other of the source and the drain of the transistor 102 is electrically connected to the wiring 132. The gate of the transistor 104 is electrically connected to the wiring 134.

The other of the source and the drain of the transistor 103 is electrically connected to the wiring 128. The other electrode of the light-emitting element 114 is electrically connected to the wiring 129. The wiring 128 and the wiring 129 have a function of supplying power. For example, the wiring 128 can function as a high potential power supply line. The wiring 129 can function as a low potential power supply line.

In the structure illustrated in FIG. 4, a current flows through the light-emitting element 114 when the transistor 104 is turned on. Thus, light emission from the light-emitting element 114 can be started at a given timing after the correction data "Vw" and the image data "Vdata" are added.

Structure Example 4

Figure 5A:
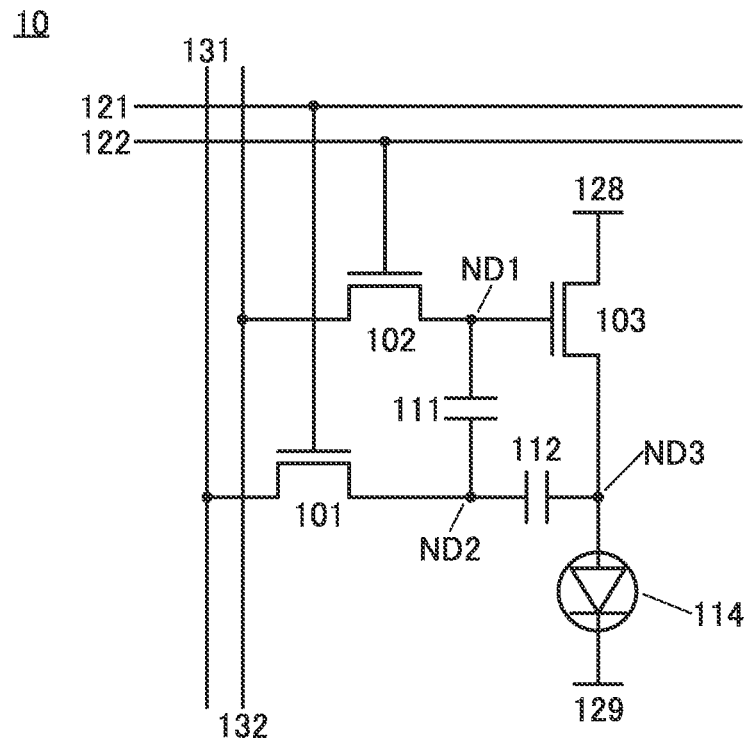
FIG. 5A and FIG. 5B are diagrams each illustrating a pixel circuit.
Figure 5B:
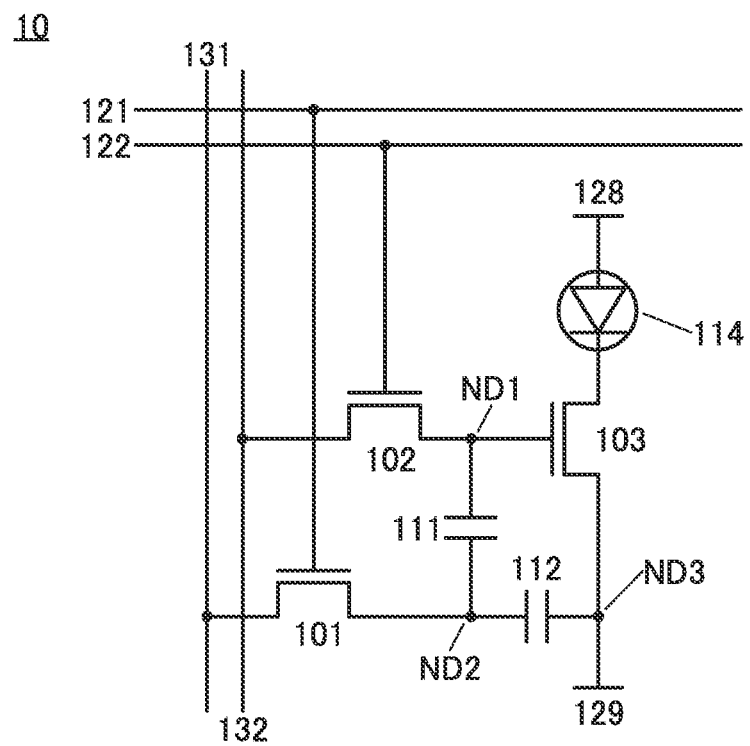

FIG. 5A and FIG. 5B each illustrate a structure different from that of the pixel 10 illustrated in FIG. 1.

The pixel 10 illustrated in FIG. 5A is different from the pixel 10 illustrated in FIG. 1 in that the transistor 104 and the wiring 133 are not provided. As described above, the transistor 104 has a function of preventing a malfunction such as flow of unintentional current through the light-emitting element 114 when the potential of the node ND3 becomes higher than or equal to the threshold voltage of the light-emitting element. Note that the transistor 104 can be omitted when a signal to be written to the node ND3 is limited to having a value lower than the threshold voltage of the light-emitting element 114. By reducing the number of transistors per pixel as in the structure of FIG. 5A, the area occupied by the pixel can be reduced, and a high-definition display apparatus can be achieved. Furthermore, the aperture ratio can be increased, and a high-luminance display apparatus can be achieved.

The pixel 10 illustrated in FIG. 5B is different from the pixel 10 illustrated in FIG. 5A in that one electrode of the light-emitting element 114 is electrically connected to one of the source and the drain of the transistor 103, and that the other electrode of the light-emitting element 114 is electrically connected to the wiring 128.

The one electrode of the light-emitting element 114 is electrically connected to one of the source and the drain of the transistor 103. The other of the source and the drain of the transistor 103 is electrically connected to one electrode of the capacitor 112. The gate of the transistor 103 is electrically connected to one of the source and the drain of the transistor 102. The gate of the transistor 103 is electrically connected to one electrode of the capacitor 111. The other electrode of the capacitor 111 is electrically connected to the other electrode of the capacitor 112. The other electrode of the capacitor 111 is electrically connected to one of the source and the drain of the transistor 101.

The gate of the transistor 101 is electrically connected to the wiring 121. The gate of the transistor 102 is electrically connected to the wiring 122. The other of the source and the drain of the transistor 101 is electrically connected to the wiring 131. The other of the source and the drain of the transistor of the transistor 102 is electrically connected to the wiring 132.

The other electrode of the light-emitting element 114 is electrically connected to the wiring 128. The other of the source and the drain of the transistor 103 is electrically connected to the wiring 129. The wiring 128 and the wiring 129 have a function of supplying power. For example, the wiring 128 can function as a high potential power supply line. The wiring 129 can function as a low potential power supply line.

The pixel 10 illustrated in FIG. 5B can stably perform addition of the correction data "Vw" and the image data "Vdata" because the node ND3 is connected to the wiring 129 for supplying a fixed potential.

Figure 6A:
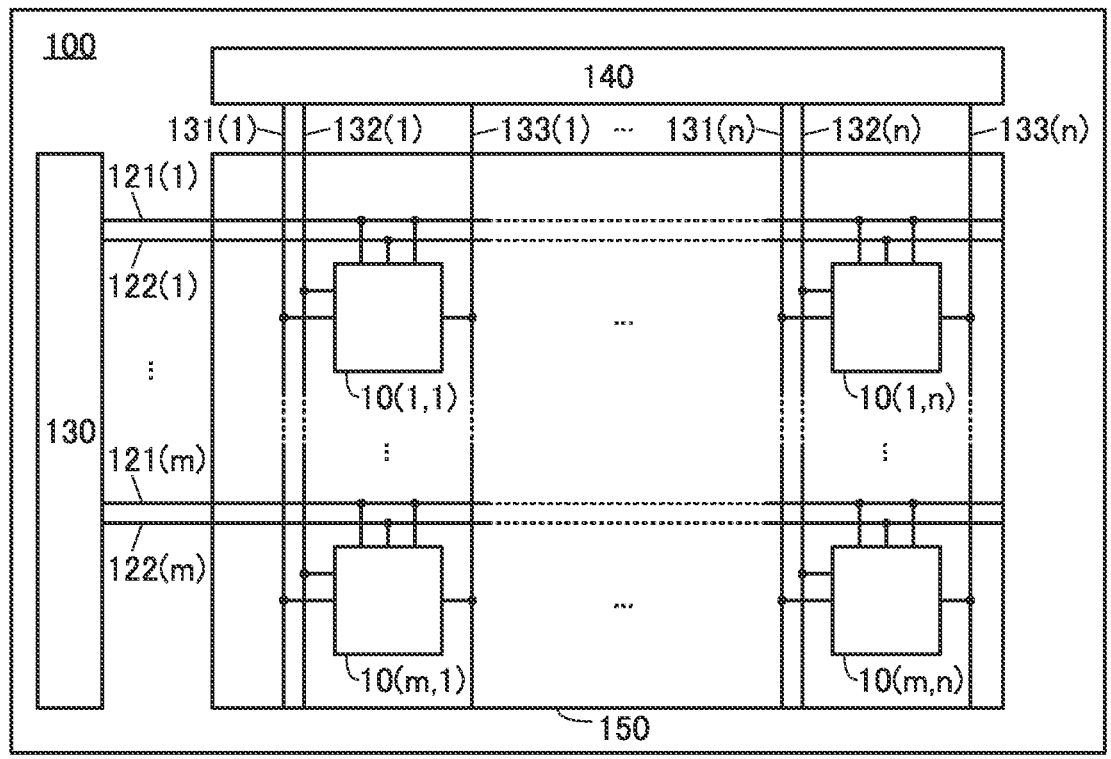
FIG. 6A is a diagram illustrating circuit blocks.

FIG. 6A is a block diagram of a display apparatus 100 employing the aforementioned structure of the pixel 10. The display apparatus 100 includes a display portion 150, a gate driver 130, and a source driver 140. The display portion 150 includes a plurality of pixels 10(1,1) to 10(m,n) that can be arranged in a matrix. Note that m and n are each an integer greater than or equal to 1.

The plurality of pixels 10 are supplied with signals from the gate driver 130 through a plurality of wirings (e.g., the wirings 121) so that driving of the pixels is controlled. In addition, the plurality of pixels 10 are supplied with signals from the source driver 140 through a plurality of wirings (e.g., the wirings 131) so that driving of the pixels is controlled.

Figure 6B:
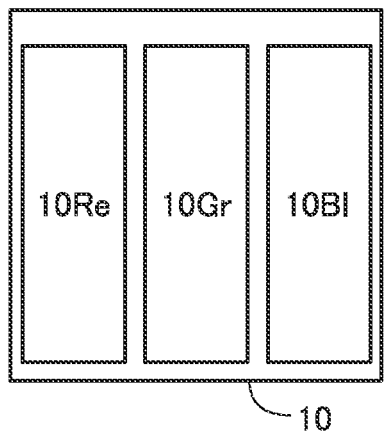
FIG. 6B and FIG. 6C are diagrams each illustrating a structure of a pixel.
Figure 6C:
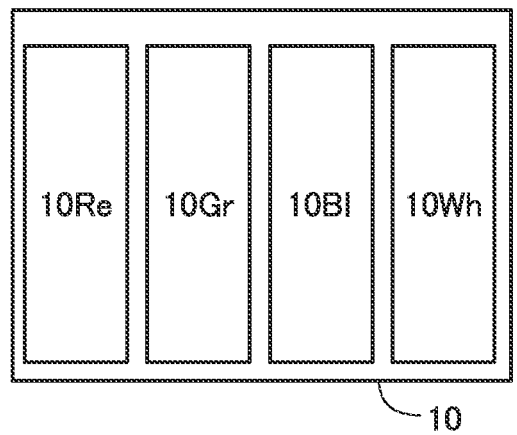

In the case of performing color display, the pixel 10 corresponds to a subpixel 10Re, a subpixel 10Gr, and a subpixel 10Bl with the three primary colors R (red), G (green), and B (blue) as illustrated in FIG. 6B, and one pixel is composed of a combination of a plurality of subpixels. Note that the number and combination of colors of subpixels are not limited to three and RGB, respectively. Forming one pixel with a combination of the subpixel 10Re, the subpixel 10Gr, the subpixel 10Bl, and a subpixel 10Wh with four colors R, G, B, and W (white) as illustrated in FIG. 6C is also effective. Moreover, one pixel can be formed with a combination of subpixels with four colors R, G, B, and Y (yellow).

This embodiment can be implemented in an appropriate combination with any of the structures described in the other embodiments and the like.

Embodiment 2

In this embodiment, structure examples of a display apparatus using a light-emitting device will be described. Note that the description of the components, operations, and functions of the display apparatus described in Embodiment 1 is omitted in this embodiment.

The pixel described in Embodiment 1 can be used in the display apparatus described in this embodiment. Note that a scan line driver circuit and a signal line driver circuit that are described below correspond to the gate driver and the source driver, respectively.

Figure 7A:
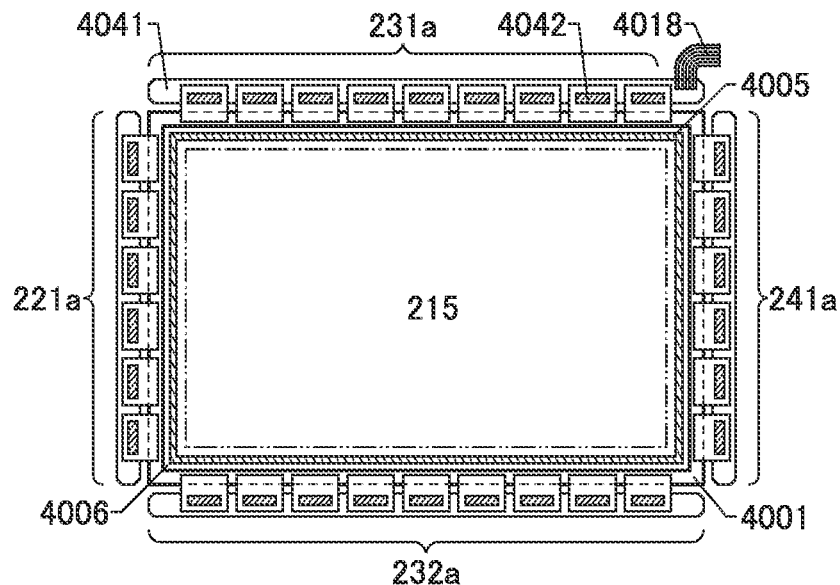
FIG. 7A, FIG. 7B, and FIG. 7C are diagrams each illustrating a display apparatus.
Figure 7B:
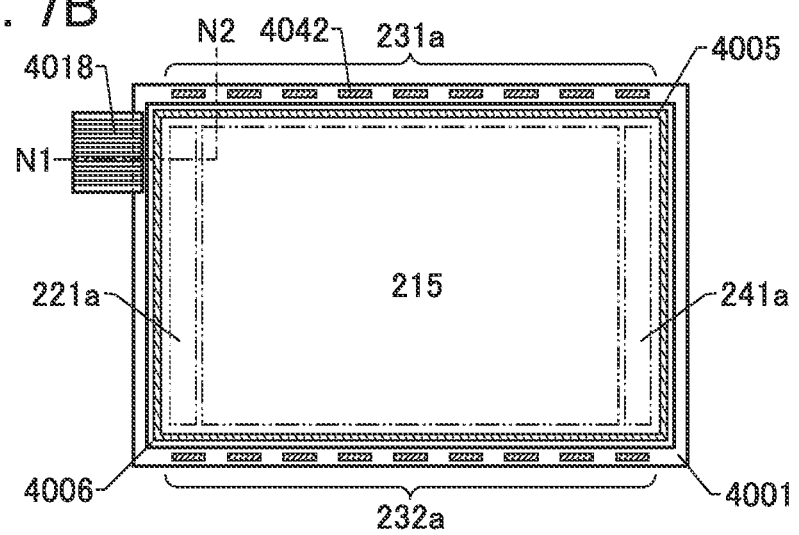
Figure 7C:
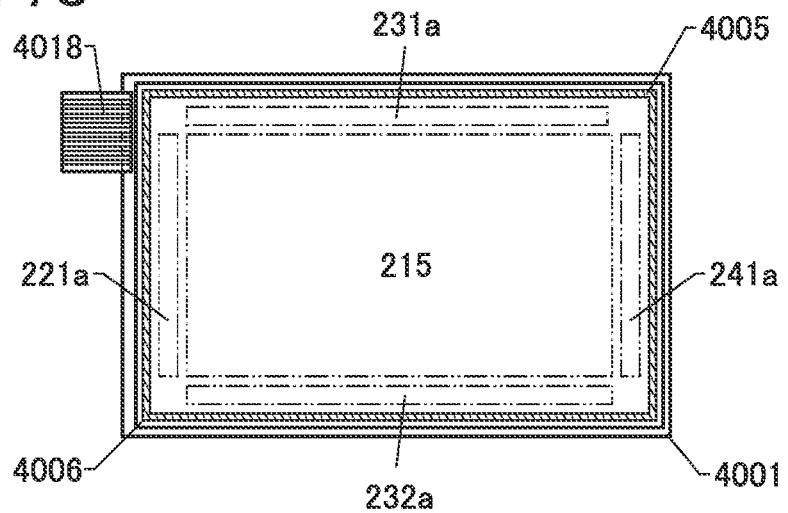

FIG. 7A to FIG. 7C are diagrams each illustrating a structure of a display apparatus in which one embodiment of the present invention can be used.

In FIG. 7A, a sealant 4005 is provided to surround a display portion 215 provided over a first substrate 4001, and the display portion 215 is sealed with the sealant 4005 and a second substrate 4006.

In FIG. 7A, a scan line driver circuit 221a, a signal line driver circuit 231a, a signal line driver circuit 232a, and a common line driver circuit 241a each include a plurality of integrated circuits 4042 provided on a printed circuit board 4041. The integrated circuits 4042 are each formed using a single crystal semiconductor or a polycrystalline semiconductor. The common line driver circuit 241a has a function of supplying a predetermined potential to the wiring 129 described in Embodiment 1, for example.

Various signals and potentials are supplied to the scan line driver circuit 221a, the common line driver circuit 241a, the signal line driver circuit 231a, and the signal line driver circuit 232a through an FPC (Flexible Printed Circuit) 4018.

The integrated circuits 4042 included in the scan line driver circuit 221a and the common line driver circuit 241a have a function of supplying a selection signal to the display portion 215. The integrated circuits 4042 included in the signal line driver circuit 231a and the signal line driver circuit 232a have a function of supplying image data to the display portion 215. The integrated circuits 4042 are mounted in a region different from the region surrounded by the sealant 4005 over the first substrate 4001.

Note that the connection method of the integrated circuits 4042 is not particularly limited; a wire bonding method, a COF method, a COG method, a TCP method, or the like can be used.

FIG. 7B illustrates an example of mounting the integrated circuits 4042 included in the signal line driver circuit 231a and the signal line driver circuit 232a by a COG method.

Some or all of the driver circuits can be integrated over the same substrate as the display portion 215, whereby a system-on-panel can be formed.

FIG. 7B shows the example in which the scan line driver circuit 221a and the common line driver circuit 241a are formed over the same substrate as the display portion 215. When the driver circuits are formed concurrently with pixel circuits in the display portion 215, the number of components can be reduced. Thus, the productivity can be increased.

In FIG. 7B, the sealant 4005 is provided to surround the display portion 215, the scan line driver circuit 221a, and the common line driver circuit 241a that are provided over the first substrate 4001. The second substrate 4006 is provided over the display portion 215, the scan line driver circuit 221a, and the common line driver circuit 241a. Thus, the display portion 215, the scan line driver circuit 221a, and the common line driver circuit 241a are sealed together with a display device with the use of the first substrate 4001, the sealant 4005, and the second substrate 4006.

Although the signal line driver circuit 231a and the signal line driver circuit 232a are formed separately and mounted on the first substrate 4001 in the example illustrated in FIG. 7B, one embodiment of the present invention is not limited to this structure. The scan line driver circuit may be separately formed and then mounted, or part of the signal line driver circuit or part of the scan line driver circuit may be separately formed and then mounted. The signal line driver circuit 231a and the signal line driver circuit 232a may be formed over the same substrate as the display portion 215, as illustrated in FIG. 7C.

In some cases, the display apparatus include a panel in which the display device is sealed, and a module in which an IC or the like including a controller is mounted on the panel.

The display portion and the scan line driver circuit provided over the first substrate each include a plurality of transistors. As the transistors, the Si transistor or the OS transistor described in Embodiment 1 can be used.

The structure of the transistors included in the peripheral driver circuit may be the same as or different from the structure of the transistors included in the pixel circuits of the display portion. The transistors included in the peripheral driver circuit may have the same structure, or may have two or more kinds of structures. Similarly, the transistors included in the pixel circuits may have the same structure, or may have two or more kinds of structures.

An input device 4200 can be provided over the second substrate 4006. The display apparatuses illustrated in FIG. 7A to FIG. 7C and provided with the input device 4200 can function as a touch panel.

There is no limitation on a sensor device (also referred to as a sensor element) included in the touch panel of one embodiment of the present invention. A variety of sensors capable of sensing an approach or a contact of a sensing target such as a finger or a stylus can be used as the sensor device.

It is possible to use a sensor of any of a variety of types, such as a capacitive type, a resistive type, a surface acoustic wave type, an infrared type, an optical type, and a pressure-sensitive type.

In this embodiment, a touch panel including a capacitive-type sensor device is described as an example.

Examples of the capacitive type include a surface capacitive type and a projected capacitive type. Examples of the projected capacitive type include a self-capacitive type and a mutual capacitive type. The use of a mutual capacitive type is preferred because multiple points can be sensed simultaneously.

The touch panel of one embodiment of the present invention can have any of a variety of structures, including a structure in which a display apparatus and a sensor device that are separately formed are attached to each other and a structure in which an electrode and the like included in a sensor device are provided on one or both of a substrate supporting a display device and a counter substrate.

Figure 8A:
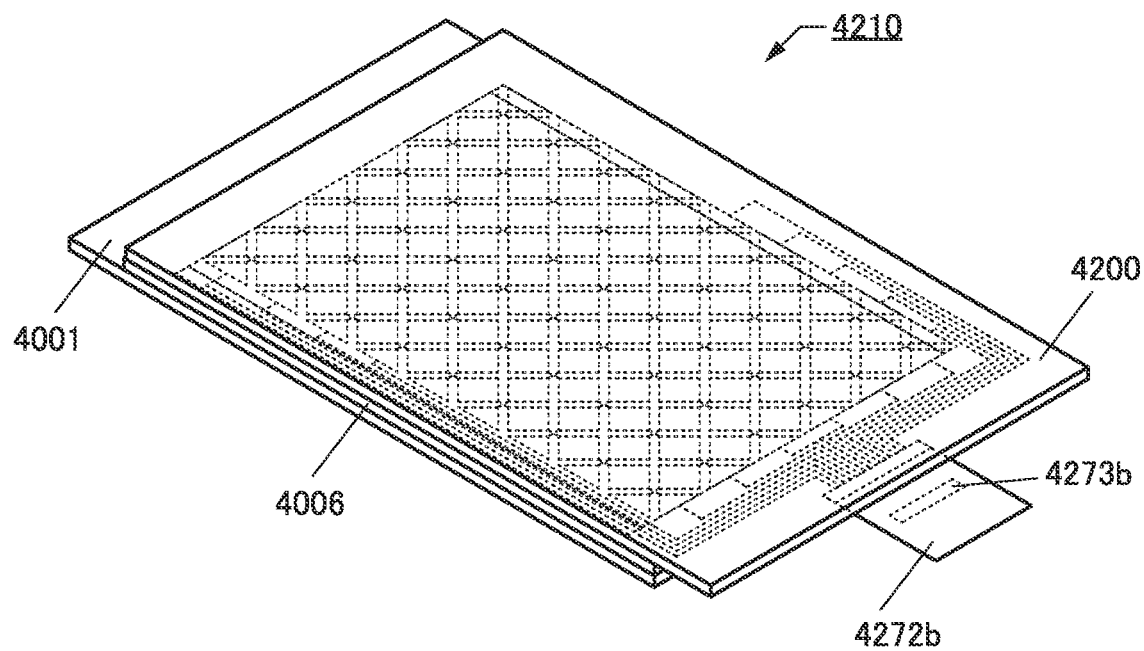
FIG. 8A and FIG. 8B are diagrams illustrating a touch panel.
Figure 8B:
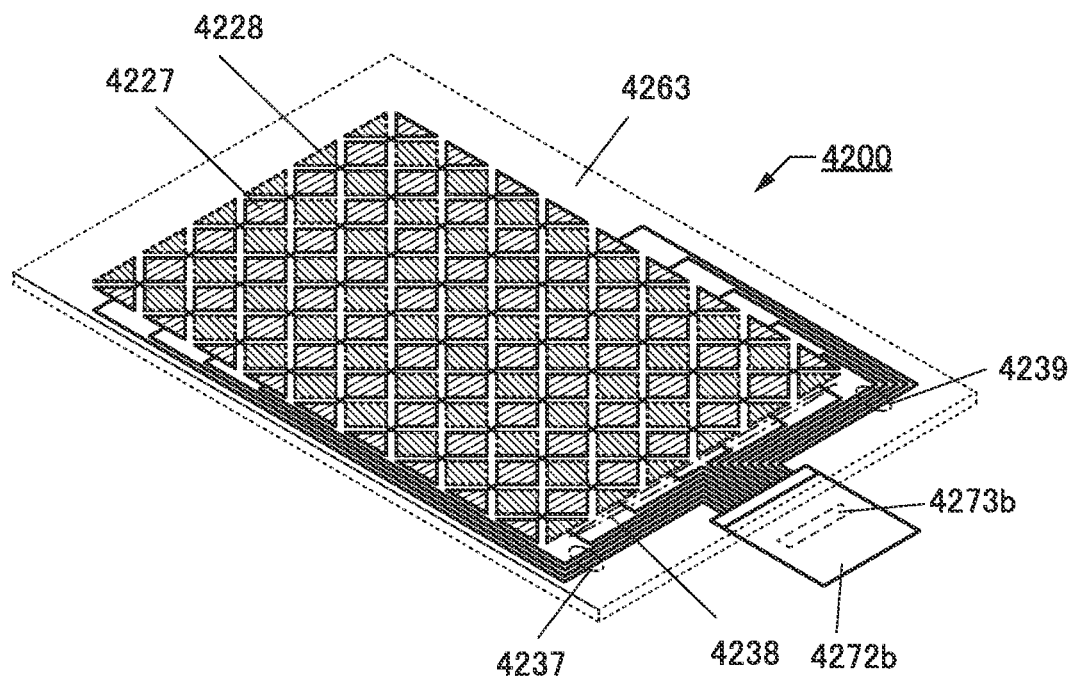

FIG. 8A and FIG. 8B illustrate an example of a touch panel. FIG. 8A is a perspective view of a touch panel 4210. FIG. 8B is a schematic perspective view of the input device 4200. Note that for clarity, only typical components are illustrated.

The touch panel 4210 has a structure in which a display apparatus and a sensor device that are separately formed are attached to each other.

The touch panel 4210 includes the input device 4200 and the display apparatus that are provided to overlap each other.

The input device 4200 includes a substrate 4263, an electrode 4227, an electrode 4228, a plurality of wirings 4237, a plurality of wirings 4238, and a plurality of wirings 4239. For example, the electrode 4227 can be electrically connected to the wiring 4237 or the wiring 4239. The electrode 4228 can be electrically connected to the wiring 4239. An FPC 4272*b* is electrically connected to each of the plurality of wirings 4237 and the plurality of wirings 4238. An IC 4273*b* can be provided for the FPC 4272*b*.

Alternatively, a touch sensor may be provided between the first substrate 4001 and the second substrate 4006 in the display apparatus. In the case where a touch sensor is provided between the first substrate 4001 and the second substrate 4006, a capacitive touch sensor or an optical touch sensor including a photoelectric conversion element may be used.

Figure 9:
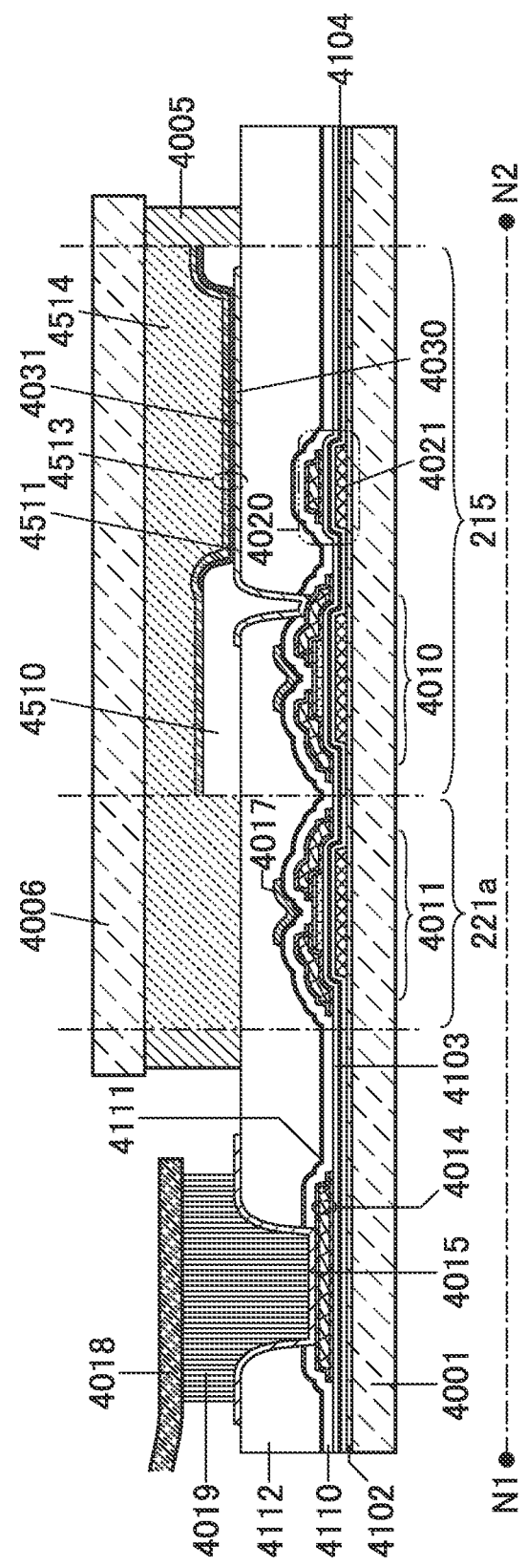
FIG. 9 is a diagram illustrating a display apparatus.

FIG. 9 is a cross-sectional view along the chain line N1-N2 in FIG. 7B. A display apparatus illustrated in FIG. 9 includes an electrode 4015, and the electrode 4015 is electrically connected to a terminal included in an FPC 4018 through an anisotropic conductive layer 4019. Furthermore, in FIG. 9, the electrode 4015 is electrically connected to a wiring 4014 in an opening formed in an insulating layer 4112, an insulating layer 4111, and an insulating layer 4110.

The electrode 4015 is formed of the same conductive layer as a first electrode layer 4030, and the wiring 4014 is formed of the same conductive layer as source electrodes and drain electrodes of a transistor 4010 and a transistor 4011.

The display portion 215 and the scan line driver circuit 221*a* provided over the first substrate 4001 each include a plurality of transistors. In FIG. 9, the transistor 4010 included in the display portion 215 and the transistor 4011 included in the scan line driver circuit 221*a* are shown as an example. Note that the transistor 4010 and the transistor 4011 are shown as bottom-gate transistors in FIG. 9 but may be top-gate transistors.

In FIG. 9, the insulating layer 4112 is provided over the transistor 4010 and the transistor 4011. In addition, a partition 4510 is formed over the insulating layer 4112.

The transistor 4010 and the transistor 4011 are provided over an insulating layer 4102. The transistor 4010 and the transistor 4011 each include an electrode 4017 formed over the insulating layer 4111. The electrode 4017 can function as a back gate electrode.

The display apparatus illustrated in FIG. 9 includes a capacitor 4020. The capacitor 4020 includes an electrode 4021 formed in the same step as a gate electrode of the transistor 4010, and an electrode formed in the same step as the source electrode and the drain electrode. The electrodes overlap each other with an insulating layer 4103 therebetween.

In general, the capacitance of a capacitor provided in a pixel portion of a display apparatus is set in consideration of the leakage current or the like of transistors provided in the pixel portion so that charges can be held for a predetermined period. The capacitance of the capacitor is set in consideration of the off-state current of the transistors or the like.

The transistor 4010 provided in the display portion 215 is electrically connected to the display device. FIG. 9 illustrates an example of a light-emitting display apparatus using a light-emitting device as a display device (also referred to as an "EL display apparatus"). A light-emitting device 4513 serving as the display device is electrically connected to the transistor 4010 provided in the display portion 215. Note that the structure of the light-emitting device 4513 is a stacked-layer structure of the first electrode layer 4030, a light-emitting layer 4511, and the second electrode layer 4031; however, one embodiment of the present invention is not limited to this structure. The structure of the light-emitting device 4513 can be changed as appropriate depending on the direction in which light is extracted from the light-emitting device 4513, or the like.

The display apparatus illustrated in FIG. 9 includes the insulating layer 4111 and an insulating layer 4104. As the insulating layer 4111 and the insulating layer 4104, insulating layers through which an impurity element does not easily pass are used. A semiconductor layer of the transistor is positioned between the insulating layer 4111 and the insulating layer 4104, whereby entry of impurities from the outside can be prevented.

A light-emitting device can be used as the display device included in the display apparatus. As the light-emitting device, for example, an EL device that utilizes electroluminescence can be used. An EL device includes a layer containing a light-emitting compound (also referred to as an "EL layer") between a pair of electrodes. By generating a potential difference between the pair of electrodes that is greater than the threshold voltage of the EL device, holes are injected to the EL layer from the anode side and electrons are injected to the EL layer from the cathode side. The injected electrons and holes are recombined in the EL layer, and the light-emitting compound contained in the EL layer emits light.

EL devices are classified depending on whether a light-emitting material is an organic compound or an inorganic compound; in general, the former is referred to as an organic EL device, and the latter is referred to as an inorganic EL device. Note that an LED (including a micro LED) that uses a compound semiconductor as a light-emitting material is one of EL devices.

In the organic EL device, by voltage application, electrons are injected from one electrode to the EL layer and holes are injected from the other electrode to the EL layer. The carriers (electrons and holes) are recombined, the light-emitting organic compound forms an excited state, and the organic compound emits light when the excited state returns to a ground state. Owing to such a mechanism, this light-emitting device is referred to as a current-excitation light-emitting device.

Note that in addition to the light-emitting compound, the EL layer may further include a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

The EL layer can be formed by a method such as an evaporation method (including a vacuum evaporation method), a transfer method, a printing method, an inkjet method, or a coating method.

The inorganic EL devices are classified according to their device structures into a dispersion-type inorganic EL device and a thin-film inorganic EL device. A dispersion-type inorganic EL device includes a light-emitting layer where particles of a light-emitting material are dispersed in a binder, and its light emission mechanism is donor-acceptor recombination type light emission that utilizes a donor level and an acceptor level. A thin-film inorganic EL device has a structure where a light-emitting layer is positioned between dielectric layers, which are further positioned between electrodes, and its light emission mechanism is localization type light emission that utilizes inner-shell electron transition of metal ions. Note that the description is made here using an organic EL device as the light-emitting device.

In order to extract light emitted from the light-emitting device, at least one of the pair of electrodes needs to be transparent. A transistor and a light-emitting device are formed over a substrate. The light-emitting device can have a top emission structure in which light emission is extracted from the surface on the side opposite to the substrate; a bottom emission structure in which light emission is extracted from the surface on the substrate side; or a dual emission structure in which light emission is extracted from both surfaces. The light-emitting device having any of the emission structures can be used.

The partition 4510 is formed using an organic insulating material or an inorganic insulating material. It is particularly preferable that the partition 4510 be formed using a photosensitive resin material to have an opening portion over the first electrode layer 4030 such that a side surface of the opening portion slopes with continuous curvature.

The light-emitting layer 4511 may be formed using a single layer or a plurality of layers stacked.

The emission color of the light-emitting device 4513 can be white, red, green, blue, cyan, magenta, yellow, or the like depending on the material for the light-emitting layer 4511.

As a color display method, there are a method in which the light-emitting device 4513 that emits white light is combined with a coloring layer and a method in which the light-emitting device 4513 that emits light of a different emission color is provided in each pixel. The former method is more productive than the latter method. The latter method, which requires separate formation of the light-emitting layer 4511 pixel by pixel, is less productive than the former method. However, the latter method can provide higher color purity of the emission color than the former method. In the latter method, the color purity can be further increased when the light-emitting device 4513 has a microcavity structure.

Note that the light-emitting layer 4511 may contain an inorganic compound such as quantum dots. For example, when used for the light-emitting layer, the quantum dots can function as a light-emitting material.

A protective layer may be formed over the second electrode layer 4031 and the partition 4510 in order to prevent entry of oxygen, hydrogen, moisture, carbon dioxide, or the like into the light-emitting device 4513. For the protective layer, silicon nitride, silicon nitride oxide, aluminum oxide, aluminum nitride, aluminum oxynitride, aluminum nitride oxide, DLC (Diamond Like Carbon), or the like can be used. In a space enclosed by the first substrate 4001, the second substrate 4006, and the sealant 4005, a filler 4514 is provided for sealing. It is preferable that the light-emitting device be packaged (sealed) with a protective film (such as a laminate film or an ultraviolet curable resin film) or a cover member with high air-tightness and little degasification in this manner so that the light-emitting device is not exposed to the outside air.

As the filler 4514, an ultraviolet curable resin or a thermosetting resin can be used as well as an inert gas such as nitrogen or argon; PVC (polyvinyl chloride), an acrylic-based resin, polyimide, an epoxy-based resin, a silicone-based resin, PVB (polyvinyl butyral), EVA (ethylene vinyl acetate), or the like can be used. A drying agent may be contained in the filler 4514.

A glass material such as a glass frit or a resin material such as a curable resin that is curable at room temperature, such as a two-component-mixture-type resin, a light curable resin, or a thermosetting resin can be used for the sealant 4005. A drying agent may be contained in the sealant 4005.

If necessary, an optical film such as a polarizing plate, a circularly polarizing plate (including an elliptically polarizing plate), a retardation plate (a quarter-wave plate or a half-wave plate), or a color filter may be provided as appropriate on an emission surface of the light-emitting device. Furthermore, the polarizing plate or the circularly polarizing plate may be provided with an anti-reflection film. For example, anti-glare treatment by which reflected light can be diffused by projections and depressions on a surface so as to reduce the glare can be performed.

When the light-emitting device has a microcavity structure, light with high color purity can be extracted. Furthermore, when a microcavity structure and a color filter are combined, the glare can be reduced and visibility of a displayed image can be increased.

The first electrode layer and the second electrode layer (also referred to as a pixel electrode layer, a common electrode layer, a counter electrode layer, and the like) for applying voltage to the display device each have a light-transmitting property or a light-reflecting property, which depends on the direction in which light is extracted, the position where the electrode layer is provided, and the pattern structure of the electrode layer.

Each of the first electrode layer 4030 and the second electrode layer 4031 can be formed using a conductive material having a light-transmitting property, such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

Each of the first electrode layer 4030 and the second electrode layer 4031 can be formed using one or more kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a metal nitride thereof.

Each of the first electrode layer 4030 and the second electrode layer 4031 can be formed using a conductive composition containing a conductive high molecule (also referred to as a conductive polymer). As the conductive high molecule, a so-called π-electron conjugated conductive high molecule can be used. Examples include polyaniline or a derivative thereof, polypyrrole or a derivative thereof, polythiophene or a derivative thereof, and a copolymer of two or more of aniline, pyrrole, and thiophene or a derivative thereof.

Since the transistor is easily broken by static electricity or the like, a protective circuit for protecting the driver circuit is preferably provided. The protective circuit is preferably formed using a nonlinear element.

A spacer (not illustrated) may be provided between the first electrode layer 4030 and the second electrode layer 4031. The spacer has a function of controlling the distance (cell gap) between the first electrode layer 4030 and the second electrode layer 4031. There is no particular limitation on the shape of the spacer. As the spacer, a columnar spacer, a spherical spacer, or the like can be used, for example.

A black matrix (a light-blocking layer); a coloring layer (a color filter); an optical member (an optical substrate) such as a polarizing member, a retardation member, or an anti-reflection member; or the like may be provided as appropriate if needed. For example, circular polarization may be employed by using a polarizing substrate and a retardation substrate.

Figure 10:
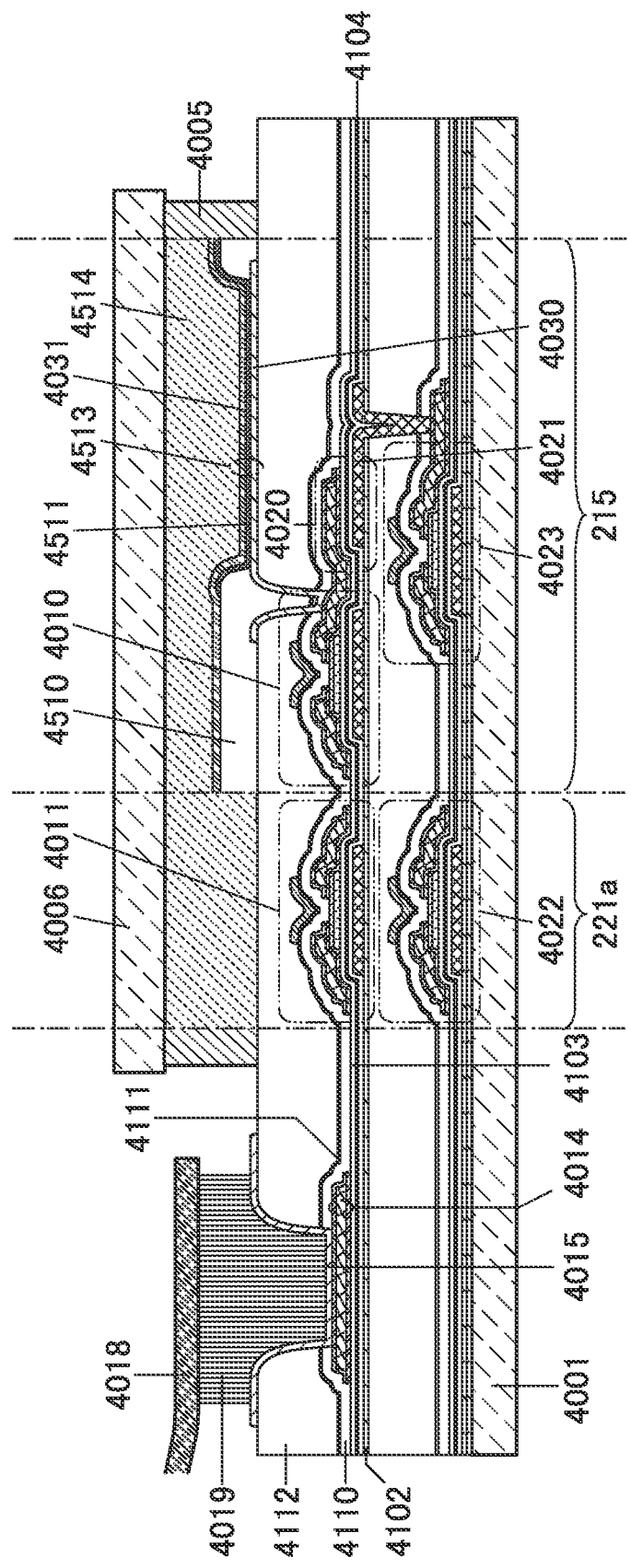
FIG. 10 is a diagram illustrating a display apparatus.

Note that as illustrated in FIG. 10, a stacked structure including a region where a transistor and a capacitor overlap each other in the height direction may be employed. For example, when the transistor 4011 and a transistor 4022 included in the driver circuit are provided to overlap each other, a display apparatus with a narrow frame can be provided. Furthermore, when the transistor 4010, a transistor 4023, the capacitor 4020, and the like included in the pixel circuit are provided to at least partly overlap each other, the aperture ratio and the resolution can be increased.

A light-transmitting conductive film with high visible-light-transmitting property is used as an electrode or a wiring in the pixel circuit, whereby transmittance of light in the pixel can be increased and the aperture ratio can be substantially increased. Note that in the case where an OS transistor is used, a semiconductor layer also has a light-transmitting property and thus the aperture ratio can be further increased. These are effective even when transistors and the like are not stacked.

This embodiment can be implemented in an appropriate combination with any of the structures described in the other embodiments and the like.

Embodiment 3

In this embodiment, examples of transistors that can be used as the transistors described in the above embodiments will be described with reference to drawings.

The display apparatus of one embodiment of the present invention can be manufactured using a transistor with any of various structures, such as a bottom-gate transistor or a top-gate transistor. Therefore, a material used for a semiconductor layer or the structure of a transistor can be easily changed depending on the existing production line.

<Bottom-Gate Transistor>

FIG. 11A1 is a cross-sectional view of a channel-protective transistor 810, which is a type of bottom-gate transistor, in the channel length direction. In FIG. 11A1, the transistor 810 is formed over a substrate 771. The transistor 810 includes an electrode 746 over the substrate 771 with an insulating layer 772 therebetween. The transistor 810 also includes a semiconductor layer 742 over the electrode 746 with an insulating layer 726 therebetween. The electrode 746 can function as a gate electrode. The insulating layer 726 can function as a gate insulating layer.

The transistor 810 includes an insulating layer 741 over a channel formation region of the semiconductor layer 742. The transistor 810 also includes an electrode 744a and an electrode 744b that are over the insulating layer 726 and in contact with part of the semiconductor layer 742. The electrode 744a can function as one of a source electrode and a drain electrode. The electrode 744b can function as the other of the source electrode and the drain electrode. Part of the electrode 744a and part of the electrode 744b are formed over the insulating layer 741.

The insulating layer 741 can function as a channel protective layer. Providing the insulating layer 741 over the channel formation region can prevent exposure of the semiconductor layer 742 that would be caused at the time of forming the electrode 744a and the electrode 744b. Thus, the channel formation region of the semiconductor layer 742 can be prevented from being etched at the time of forming the electrode 744a and the electrode 744b. According to one embodiment of the present invention, a transistor with favorable electrical characteristics can be provided.

The transistor 810 includes an insulating layer 728 over the electrode 744a, the electrode 744b, and the insulating layer 741 and also includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used at least for portions of the electrode 744a and the electrode 744b that are in contact with the semiconductor layer 742. The carrier concentration in the regions of the semiconductor layer 742 where oxygen vacancies are generated is increased, so that the regions become n-type regions ($n^+$ regions). Accordingly, the regions can function as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 can reduce contact resistance between the semiconductor layer 742 and each of the electrode 744a and the electrode 744b. Thus, the electrical characteristics of the transistor, such as the field-effect mobility and the threshold voltage, can be improved.

In the case where a semiconductor such as silicon is used for the semiconductor layer 742, a layer that functions as an n-type semiconductor or a p-type semiconductor is preferably provided between the semiconductor layer 742 and the electrode 744a and between the semiconductor layer 742 and the electrode 744b. The layer that functions as an n-type semiconductor or a p-type semiconductor can function as the source region or the drain region of the transistor.

The insulating layer 729 is preferably formed using a material that has a function of preventing or reducing diffusion of impurities into the transistor from the outside. Note that the insulating layer 729 can be omitted as necessary.

A transistor 811 illustrated in FIG. 11A2 is different from the transistor 810 in that an electrode 723 that can function as a back gate electrode is provided over the insulating layer 729. The electrode 723 can be formed using a material and a method similar to those for the electrode 746.

In general, a back gate electrode is formed using a conductive layer and positioned so that a channel formation region in a semiconductor layer is positioned between the gate electrode and the back gate electrode. Thus, the back gate electrode can function in a manner similar to that of the gate electrode. The potential of the back gate electrode may be the same as the potential of the gate electrode, or may be a ground potential (GND potential) or a given potential. When the potential of the back gate electrode is changed independently of the potential of the gate electrode, the threshold voltage of the transistor can be changed.

The electrode 746 and the electrode 723 can each function as a gate electrode. Thus, the insulating layer 726, the insulating layer 728, and the insulating layer 729 can each function as a gate insulating layer. The electrode 723 may be provided between the insulating layer 728 and the insulating layer 729.

In the case where one of the electrode 746 and the electrode 723 is referred to as a "gate electrode", the other is referred to as a "back gate electrode". For example, in the transistor 811, in the case where the electrode 723 is referred to as a "gate electrode", the electrode 746 is referred to as a "back gate electrode". In the case where the electrode 723 is used as a "gate electrode", the transistor 811 can be regarded as a kind of top-gate transistor. Moreover, one of the electrode 746 and the electrode 723 may be referred to as a "first gate electrode", and the other may be referred to as a "second gate electrode".

By providing the electrode 746 and the electrode 723 with the semiconductor layer 742 sandwiched therebetween and setting the potentials of the electrode 746 and the electrode 723 equal to each other, a region of the semiconductor layer 742 through which carriers flow is enlarged in the film thickness direction; thus, the number of transferred carriers is increased. As a result, the on-state current of the transistor 811 is increased and the field-effect mobility is increased.

Therefore, the transistor 811 is a transistor having high on-state current for its occupied area. That is, the area occupied by the transistor 811 can be small for required on-state current. According to one embodiment of the present invention, the area occupied by a transistor can be reduced. Consequently, according to one embodiment of the present invention, a semiconductor device having a high degree of integration can be provided.

The gate electrode and the back gate electrode are formed using conductive layers and thus each have a function of preventing an electric field generated outside the transistor from affecting the semiconductor layer in which the channel is formed (in particular, an electric field blocking function against static electricity and the like). When the back gate electrode is formed larger than the semiconductor layer such that the semiconductor layer is covered with the back gate electrode, the electric field blocking function can be enhanced.

When the back gate electrode is formed using a conductive film having a light-blocking property, light can be prevented from entering the semiconductor layer from the back gate electrode side. Consequently, photodegradation of the semiconductor layer can be prevented, and degradation in electrical characteristics of the transistor, such as a shift of the threshold voltage, can be prevented.

According to one embodiment of the present invention, a transistor with favorable reliability can be provided. Moreover, a semiconductor device with favorable reliability can be provided.

FIG. 11B1 is a cross-sectional view of a channel-protective transistor 820 having a structure different from that in FIG. 11A1 in the channel length direction. The transistor 820 has substantially the same structure as the transistor 810 but is different from the transistor 810 in that the insulating layer 741 covers end portions of the semiconductor layer 742. Moreover, the semiconductor layer 742 is electrically connected to the electrode 744a through an opening portion formed by selectively removing part of the insulating layer 741 that overlaps the semiconductor layer 742. The semiconductor layer 742 is electrically connected to the electrode 744b through another opening portion formed by selectively removing part of the insulating layer 741 that overlaps the semiconductor layer 742. A region of the insulating layer 741 that overlaps the channel formation region can function as a channel protective layer.

A transistor 821 illustrated in FIG. 11B2 is different from the transistor 820 in that the electrode 723 that can function as a back gate electrode is provided over the insulating layer 729.

Providing the insulating layer 741 can prevent exposure of the semiconductor layer 742 that would be caused at the time of forming the electrode 744a and the electrode 744b. Thus, the semiconductor layer 742 can be prevented from being reduced in thickness at the time of forming the electrode 744a and the electrode 744b.

The distance between the electrode 744a and the electrode 746 and the distance between the electrode 744b and the electrode 746 are longer in the transistor 820 and the transistor 821 than in the transistor 810 and the transistor 811. Thus, the parasitic capacitance generated between the electrode 744a and the electrode 746 can be reduced. Moreover, the parasitic capacitance generated between the electrode 744b and the electrode 746 can be reduced. According to one embodiment of the present invention, a transistor with favorable electrical characteristics can be provided.

FIG. 11C1 is a cross-sectional view of a channel-etched transistor 825, which is a type of bottom-gate transistor, in the channel length direction. In the transistor 825, the electrode 744a and the electrode 744b are formed without the insulating layer 741. Thus, part of the semiconductor layer 742 that is exposed at the time of forming the electrode 744a and the electrode 744b may be etched. Meanwhile, since the insulating layer 741 is not provided, the productivity of the transistor can be increased.

A transistor 826 illustrated in FIG. 11C2 is different from the transistor 825 in that the electrode 723 that can function as a back gate electrode is provided over the insulating layer 729.

FIG. 12A1 to FIG. 12C2 are cross-sectional views of the transistors 810, 811, 820, 821, 825, and 826 in the channel width direction.

In each of the structures illustrated in FIG. 12B2 and FIG. 12C2, the gate electrode is connected to the back gate electrode, and the potentials of the gate electrode and the back gate electrode become equal to each other. In addition, the semiconductor layer 742 is positioned between the gate electrode and the back gate electrode.

The length of each of the gate electrode and the back gate electrode in the channel width direction is larger than the length of the semiconductor layer 742 in the channel width direction. In the channel width direction, the entire semiconductor layer 742 is covered with the gate electrode and the back gate electrode with the insulating layers 726, 741, 728, and 729 positioned therebetween.

This structure enables the semiconductor layer 742 included in the transistor to be electrically surrounded by electric fields of the gate electrode and the back gate electrode.

The transistor device structure in which the semiconductor layer 742 in which the channel formation region is formed is electrically surrounded by electric fields of the gate electrode and the back gate electrode, as in the transistor 821 or the transistor 826, can be referred to as a Surrounded channel (S-channel) structure.

With the S-channel structure, an electric field for inducing a channel can be effectively applied to the semiconductor layer 742 by one or both of the gate electrode and the back gate electrode, which improves the current drive capability of the transistor and offers high on-state current characteristics. In addition, the transistor can be miniaturized because the on-state current can be increased. The S-channel structure can also increase the mechanical strength of the transistor.

<Top-Gate Transistor>

A transistor 842 illustrated as an example in FIG. 13A1 is a type of top-gate transistor. The electrode 744*a* and the electrode 744*b* are electrically connected to the semiconductor layer 742 through opening portions formed in the insulating layer 728 and the insulating layer 729.

Part of the insulating layer 726 that is not overlapped by the electrode 746 is removed, and an impurity is introduced into the semiconductor layer 742 using the electrode 746 and the remaining insulating layer 726 as masks; hence, an impurity region can be formed in the semiconductor layer 742 in a self-aligned manner. The transistor 842 includes a region where the insulating layer 726 extends beyond end portions of the electrode 746. The semiconductor layer 742 in a region into which the impurity is introduced through the insulating layer 726 has a lower impurity concentration than the semiconductor layer 742 in a region into which the impurity is introduced not through the insulating layer 726. An LDD (Lightly Doped Drain) region is formed in the region of the semiconductor layer 742 that is not overlapped by the electrode 746.

A transistor 843 illustrated in FIG. 13A2 is different from the transistor 842 in that the electrode 723 is included. The transistor 843 includes the electrode 723 that is formed over the substrate 771. The electrode 723 includes a region overlapped by the semiconductor layer 742 with the insulating layer 772 therebetween. The electrode 723 can function as a back gate electrode.

As in a transistor 844 illustrated in FIG. 13B1 and a transistor 845 illustrated in FIG. 13B2, the insulating layer 726 in a region that is not overlapped by the electrode 746 may be completely removed. Furthermore, as in a transistor 846 illustrated in FIG. 13C1 and a transistor 847 illustrated in FIG. 13C2, the insulating layer 726 may be left.

Also in the transistor 842 to the transistor 847, after the formation of the electrode 746, an impurity is introduced into the semiconductor layer 742 using the electrode 746 as a mask, so that an impurity region can be formed in the semiconductor layer 742 in a self-aligned manner. According to one embodiment of the present invention, a transistor with favorable electrical characteristics can be provided. Furthermore, according to one embodiment of the present invention, a semiconductor device having a high degree of integration can be provided.

FIG. 14A1 to FIG. 14C2 are cross-sectional views of the transistors 842, 843, 844, 845, 846, and 847 in the channel width direction.

The transistor 843, the transistor 845, and the transistor 847 each have the above-described S-channel structure. However, one embodiment of the present invention is not limited to this, and the transistor 843, the transistor 845, and the transistor 847 do not necessarily have the S-channel structure.

This embodiment can be implemented in an appropriate combination with any of the structures described in the other embodiments and the like.

Embodiment 4

Examples of an electronic device that can use the display apparatus of one embodiment of the present invention include display devices, personal computers, image storage devices and image reproducing devices provided with storage media, mobile phones, game machines including portable game machines, portable data terminals, e-book readers, cameras such as video cameras and digital still cameras, goggles-type displays (head mounted displays), navigation systems, audio reproducing devices (e.g., car audio players and digital audio players), copiers, facsimiles, printers, multifunction printers, automated teller machines (ATM), and vending machines. FIG. 15A to FIG. 15F illustrate specific examples of such electronic devices.

Figure 15A:
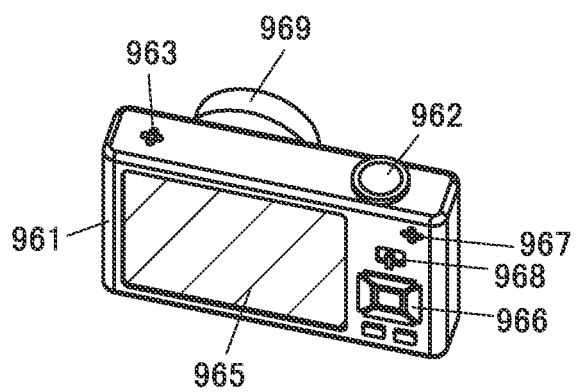
FIG. 15A, FIG. 15B, FIG. 15C, FIG. 15D, FIG. 15E, and FIG. 15F are diagrams illustrating electronic devices.

FIG. 15A illustrates a digital camera that includes a housing 961, a shutter button 962, a microphone 963, a speaker 967, a display portion 965, operation keys 966, a zoom lever 968, a lens 969, and the like. With the use of the display apparatus of one embodiment of the present invention for the display portion 965, a variety of images can be displayed.

Figure 15B:
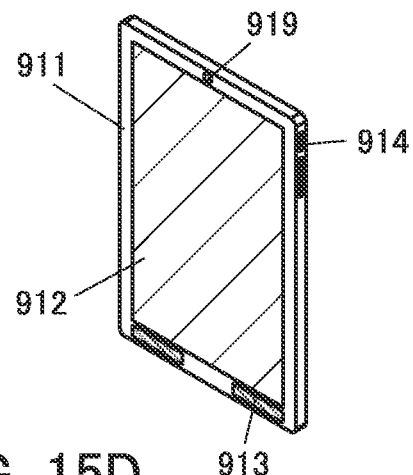

FIG. 15B illustrates a portable data terminal that includes a housing 911, a display portion 912, speakers 913, an operation button 914, a camera 919, and the like. A touch panel function of the display portion 912 enables input and output of information. With the use of the display apparatus of one embodiment of the present invention for the display portion 912, a variety of images can be displayed.

Figure 15C:
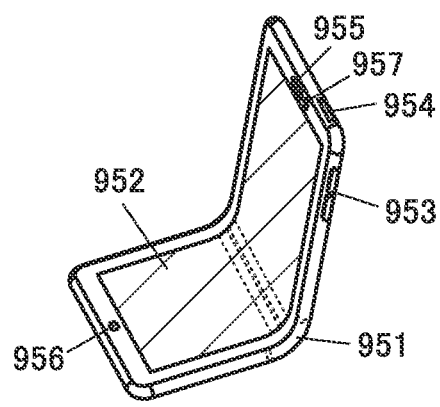

FIG. 15C illustrates a mobile phone that includes a housing 951, a display portion 952, an operation button 953, an external connection port 954, a speaker 955, a microphone 956, a camera 957, and the like. The display portion 952 of the mobile phone includes a touch sensor. Operations such as making a call and inputting text can be performed by touch on the display portion 952 with a finger, a stylus, or the like. The housing 951 and the display portion 952 have flexibility and can be used in a bent state as illustrated in the diagram. With the use of the display apparatus of one embodiment of the present invention for the display portion 952, a variety of images can be displayed.

Figure 15D:
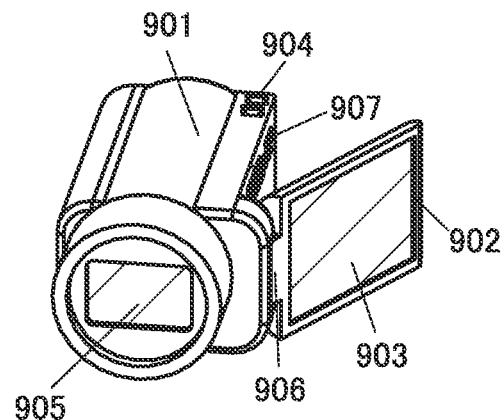

FIG. 15D illustrates a video camera that includes a first housing 901, a second housing 902, a display portion 903, an operation key 904, a lens 905, a connection portion 906, a speaker 907, and the like. The operation key 904 and the lens 905 are provided on the first housing 901, and the display portion 903 is provided on the second housing 902. With the use of the display apparatus of one embodiment of the present invention for the display portion 903, a variety of images can be displayed.

Figure 15E:
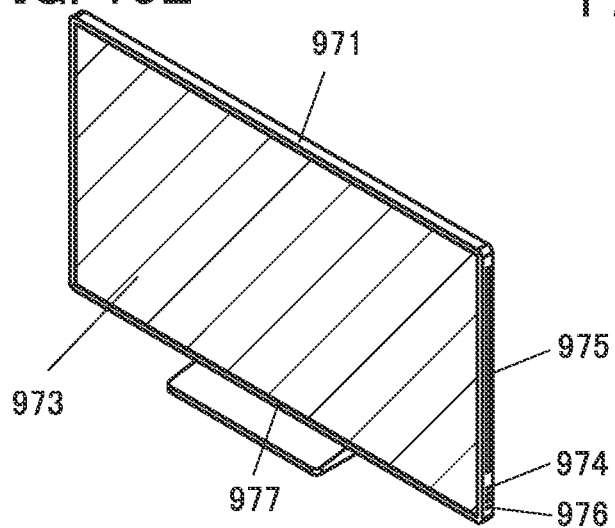

FIG. 15E illustrates a television that includes a housing 971, a display portion 973, an operation button 974, a speaker 975, a communication connection terminal 976, an optical sensor 977, and the like. The display portion 973 includes a touch sensor that enables an input operation. With the use of the display apparatus of one embodiment of the present invention for the display portion 973, a variety of images can be displayed.

Figure 15F:
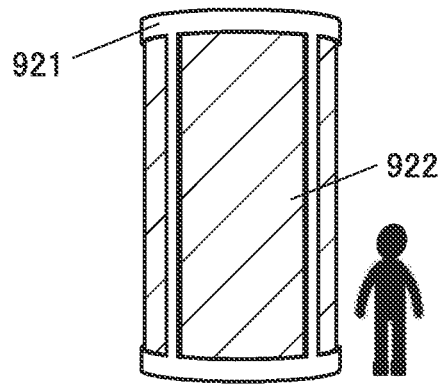

FIG. 15F illustrates digital signage that includes a large display portion 922. The large display portion 922 in the digital signage is attached to a side surface of a pillar 921, for example. With the use of the display apparatus of one embodiment of the present invention for the display portion 922, display with high display quality can be performed.

This embodiment can be implemented in an appropriate combination with any of the structures described in the other embodiments.

Example

In this example, an output of the pixel circuit having the structure illustrated in FIG. 1, obtained by addition of the correction data "Vw" and the image data "Vdata" in accordance with the timing chart in FIG. 2, was evaluated using circuit simulation.

In the simulation, the transistors were all OS transistors having a channel length of 200 μm and a channel width of 60 μm. The capacitance of each of the capacitors 111 and 112 was 11 fF. As voltages applied to the wiring 121 and the wiring 122, "High" was 5 V and "Low" was 0 V. For the wiring 131, "Vref" was 0 V and "Vdata" was 0.5 V. For the wiring 133, "V0" was 0.83 V. The simulation was performed with "Vw" of 1.30 V, 1.31 V, 1.32 V, 1.33 V, 1.34 V, and 1.35 V as a voltage applied to the wiring 132. SPICE was used as circuit simulation software.

Figure 16:
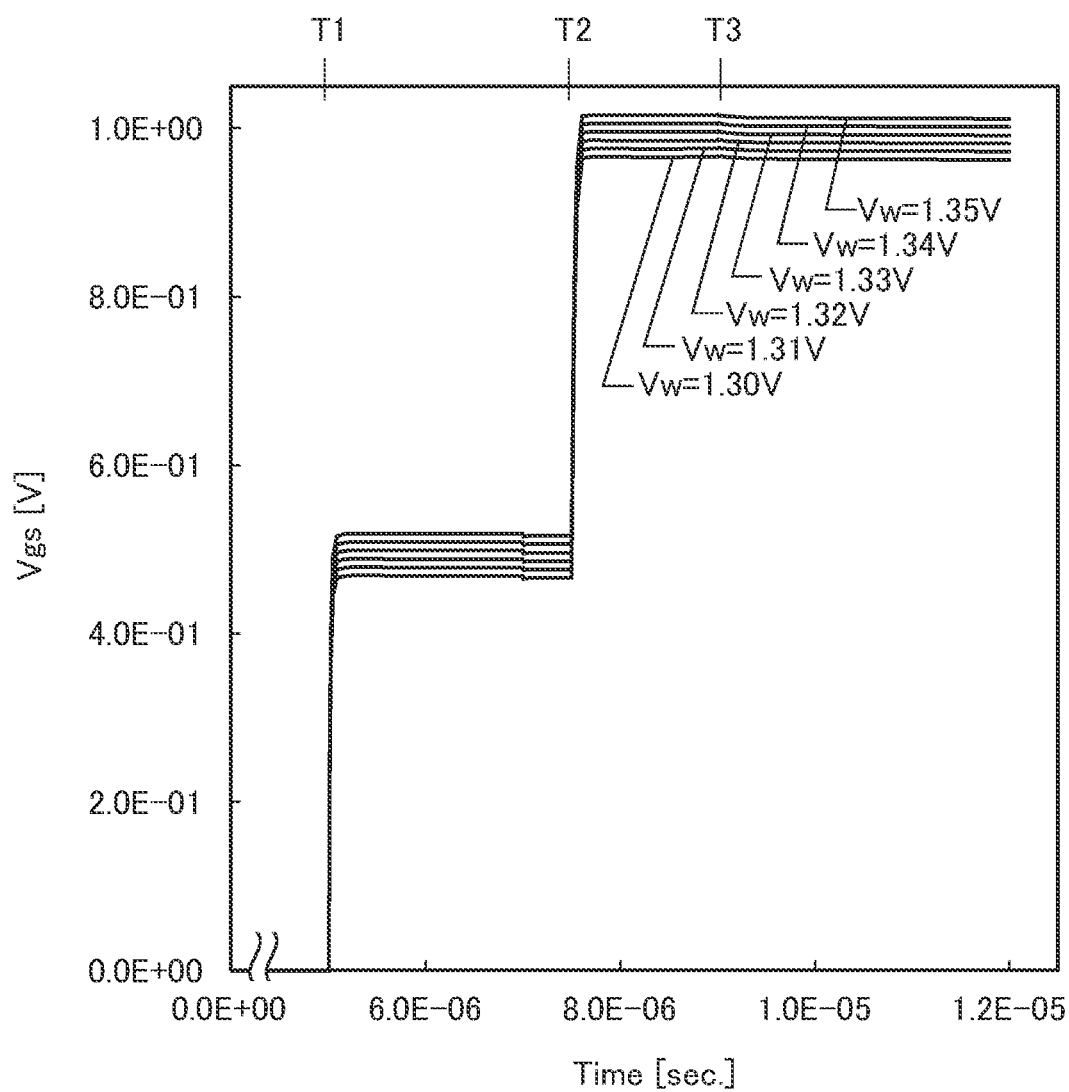
FIG. 16 is a diagram showing simulation results.
Figure 17:
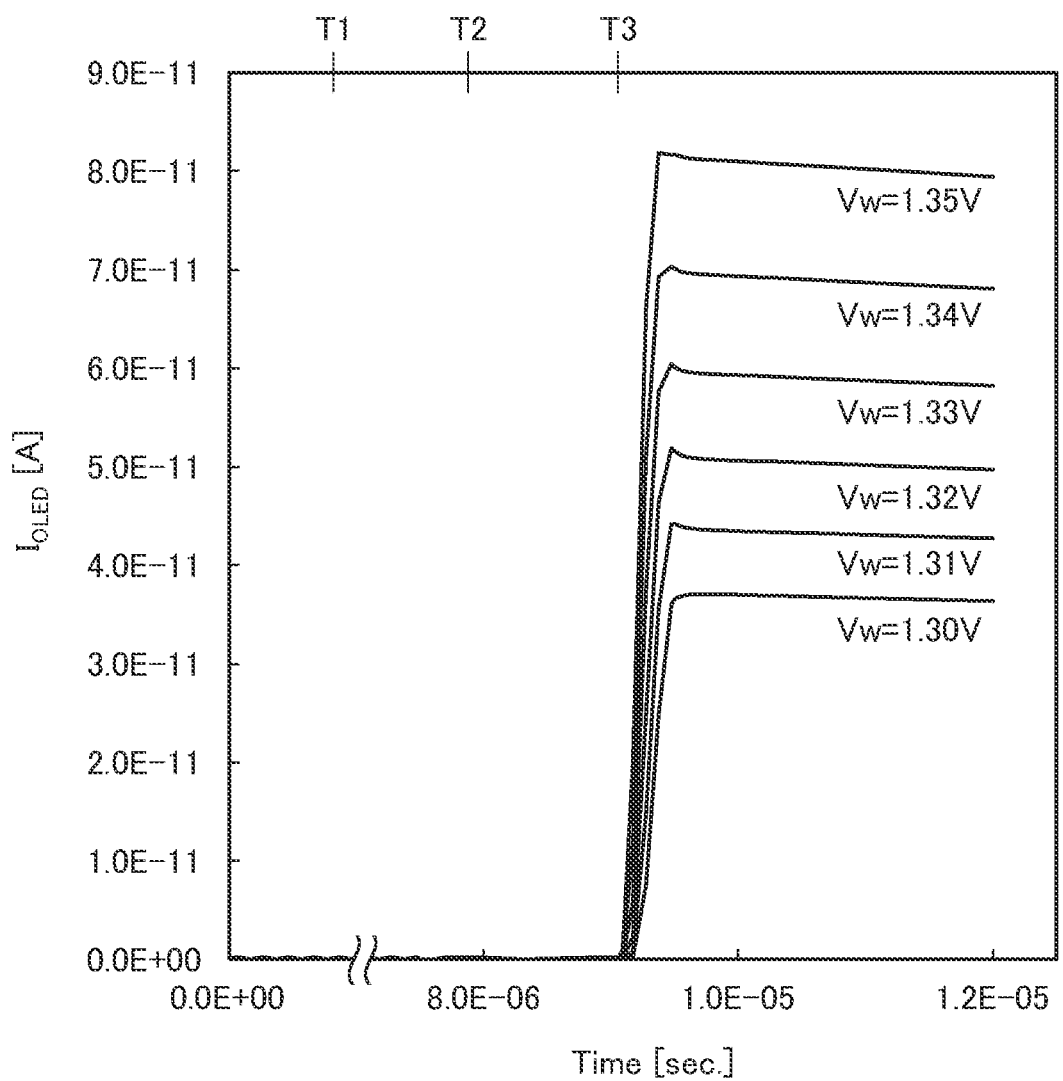
FIG. 17 is a diagram showing simulation results.

The simulation results are shown in FIG. 16 and FIG. 17. In FIG. 16, the horizontal axis represents time based on the timing chart, and the vertical axis represents the gate-source voltage (Vgs) of the transistor 103. In FIG. 17, the horizontal axis represents time based on the timing chart, and the vertical axis represents a current $I_{OLED}$ flowing through the light-emitting element 114.

As shown in FIG. 16 and FIG. 17, it was confirmed that the current flowing through the light-emitting element 114 increased in accordance with the correction data "Vw". That is, it was confirmed that the luminance of the light-emitting element 114 can be increased in accordance with the correction data "Vw".

REFERENCE NUMERALS

ND1: node, ND2: node, ND3: node, 10: pixel, 10Bl: subpixel, 10Gr: subpixel, 10Re: subpixel, 10Wh: subpixel, 100: display apparatus, 101: transistor, 102: transistor, 103: transistor, 104: transistor, 111: capacitor, 112: capacitor, 114: light-emitting element, 121: wiring, 122: wiring, 128: wiring, 129: wiring, 130: gate driver, 131: wiring, 132: wiring, 133: wiring, 134: wiring, 140: source driver, 150: display portion, 215: display portion, 221a: scan line driver circuit, 231a: signal line driver circuit, 232a: signal line driver circuit, 241a: common line driver circuit, 723: electrode, 726: insulating layer, 728: insulating layer, 729: insulating layer, 741: insulating layer, 742: semiconductor layer, 744a: electrode, 744b: electrode, 746: electrode, 771: substrate, 772: insulating layer, 810: transistor, 811: transistor, 820: transistor, 821: transistor, 825: transistor, 826: transistor, 842: transistor, 843: transistor, 844: transistor, 845: transistor, 846: transistor, 847: transistor, 901: housing, 902: housing, 903: display portion, 904: operation key, 905: lens, 906: connection portion, 907: speaker, 911: housing, 912: display portion, 913: speaker, 914: operation button, 919: camera, 921: pillar, 922: display portion, 951: housing, 952: display portion, 953: operation button, 954: external connection port, 955: speaker, 956: microphone, 957: camera, 961: housing, 962: shutter button, 963: microphone, 965: display portion, 966: operation key, 967: speaker, 968: zoom lever, 969: lens, 971: housing, 973: display portion, 974: operation button, 975: speaker, 976: communication connection terminal, 977: optical sensor, 4001: substrate, 4005: sealant, 4006: substrate, 4010: transistor, 4011: transistor, 4014: wiring, 4015: electrode, 4017: electrode, 4018: FPC, 4019: anisotropic conductive layer, 4020: capacitor, 4021: electrode, 4022: transistor, 4023: transistor, 4030: electrode layer, 4031: electrode layer, 4041: printed circuit board, 4042: integrated circuit, 4102: insulating layer, 4103: insulating layer, 4104: insulating layer, 4110: insulating layer, 4111: insulating layer, 4112: insulating layer, 4200: input device, 4210: touch panel, 4227: electrode, 4228: electrode, 4237: wiring, 4238: wiring, 4239: wiring, 4263: substrate, 4272b: FPC, 4273b: IC, 4510: partition, 4511: light-emitting layer, 4513: light-emitting device, 4514: filler

The invention claimed is:

1. A display apparatus comprising:
a light-emitting element, a first transistor, a second transistor, a third transistor, a fourth transistor, a first capacitor, a second capacitor, a first wiring, a second wiring, a third wiring, a fourth wiring, and a fifth wiring,
wherein one electrode of the light-emitting element is electrically connected to one of a source and a drain of the first transistor,
wherein the one electrode of the light-emitting element is electrically connected to one electrode of the first capacitor,
wherein a gate of the first transistor is electrically connected to one of a source and a drain of the second transistor,
wherein the gate of the first transistor is electrically connected to one electrode of the second capacitor,
wherein the other electrode of the second capacitor is electrically connected to the other electrode of the first capacitor,
wherein the other electrode of the second capacitor is electrically connected to one of a source and a drain of the third transistor,
wherein a gate of the third transistor is electrically connected to the first wiring,
wherein a gate of the second transistor is electrically connected to the second wiring,
wherein the other of the source and the drain of the third transistor is electrically connected to the third wiring,
wherein the other of the source and the drain of the second transistor is electrically connected to the fourth wiring,
wherein one of a source and a drain of the fourth transistor is electrically connected to the one electrode of the light-emitting element,
wherein the other of the source and the drain of the fourth transistor is electrically connected to the fifth wiring, and
wherein a gate of the fourth transistor is electrically connected to the first wiring.

2. The display apparatus according to claim 1,
wherein the other of the source and the drain of the first transistor is electrically connected to a high potential power supply line, and
wherein the other electrode of the light-emitting element is electrically connected to a low potential power supply line.

3. The display apparatus according to claim 1,
wherein the first transistor further comprises a back gate, and
wherein the back gate is electrically connected to the gate of the first transistor.

4. The display apparatus according to claim 1,
wherein the light-emitting element is an organic light-emitting diode.

5. The display apparatus according to claim 1,
wherein the first transistor, the second transistor, and the third transistor each comprise a metal oxide in a channel formation region, and
wherein the metal oxide comprises indium, zinc, and an element M, where the element M is one or more of aluminum, titanium, gallium, germanium, yttrium, zirconium, lanthanum, cerium, tin, neodymium, and hafnium.

6. An electronic device comprising the display apparatus according to claim 1, and a camera.

7. A display apparatus comprising:
a light-emitting element, a first transistor, a second transistor, a third transistor, a fourth transistor, a first capacitor, a second capacitor, a first wiring, a second wiring, a third wiring, a fourth wiring, and a fifth wiring,
wherein one electrode of the light-emitting element is electrically connected to one of a source and a drain of the first transistor,
wherein the one electrode of the light-emitting element is electrically connected to one electrode of the first capacitor,
wherein a gate of the first transistor is electrically connected to one of a source and a drain of the second transistor,
wherein the gate of the first transistor is electrically connected to one electrode of the second capacitor,
wherein the other electrode of the second capacitor is electrically connected to the other electrode of the first capacitor,
wherein the other electrode of the second capacitor is electrically connected to one of a source and a drain of the third transistor,
wherein a gate of the third transistor is electrically connected to the first wiring,
wherein a gate of the second transistor is electrically connected to the second wiring,
wherein the other of the source and the drain of the third transistor is electrically connected to the third wiring,
wherein the other of the source and the drain of the second transistor is electrically connected to the fourth wiring,
wherein one of a source and a drain of the fourth transistor is electrically connected to the one electrode of the light-emitting element,
wherein the other of the source and the drain of the fourth transistor is electrically connected to the fifth wiring,
wherein a gate of the fourth transistor is electrically connected to the first wiring,
wherein the third wiring is configured to supply a reference potential or a first potential,
wherein the fourth wiring is configured to supply a second potential, and
wherein the fifth wiring is configured to supply a constant potential.

8. The display apparatus according to claim 7,
wherein the other of the source and the drain of the first transistor is electrically connected to a high potential power supply line, and
wherein the other electrode of the light-emitting element is electrically connected to a low potential power supply line.

9. The display apparatus according to claim 7,
wherein the first transistor further comprises a back gate, and
wherein the back gate is electrically connected to the gate of the first transistor.

10. The display apparatus according to claim 7,
wherein the light-emitting element is an organic light-emitting diode.

11. The display apparatus according to claim 7,
wherein the first transistor, the second transistor, and the third transistor each comprise a metal oxide in a channel formation region, and
wherein the metal oxide comprises indium, zinc, and an element M, where the element M is one or more of aluminum, titanium, gallium, germanium, yttrium, zirconium, lanthanum, cerium, tin, neodymium, and hafnium.

12. An electronic device comprising the display apparatus according to claim 7, and a camera.

* * * * *